US010818727B2

(12) United States Patent
Son et al.

(10) Patent No.: US 10,818,727 B2
(45) Date of Patent: Oct. 27, 2020

(54) SEMICONDUCTOR DEVICES

(71) Applicant: Samsung Electronics Co., Ltd., Suwon-si, Gyeonggi-do (KR)

(72) Inventors: Myoungsu Son, Yongin-si (KR); Seung Pil Ko, Hwaseong-si (KR); Jung Hyuk Lee, Hwaseong-si (KR); Shinhee Han, Seongnam-si (KR); Gwan-Hyeob Koh, Seoul (KR); Yoonjong Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/161,370

(22) Filed: Oct. 16, 2018

(65) Prior Publication Data

US 2019/0326355 A1 Oct. 24, 2019

(30) Foreign Application Priority Data

Apr. 20, 2018 (KR) .......................... 10-2018-0046175

(51) Int. Cl.
*H01L 27/22* (2006.01)
*H01L 43/02* (2006.01)
*H01L 43/12* (2006.01)
*H01L 43/08* (2006.01)
*H01L 23/522* (2006.01)

(52) U.S. Cl.
CPC ............ *H01L 27/228* (2013.01); *H01L 43/02* (2013.01); *H01L 43/08* (2013.01); *H01L 43/12* (2013.01); *H01L 23/5226* (2013.01)

(58) Field of Classification Search
CPC ....... H01L 27/228; H01L 43/12; H01L 43/02; H01L 43/08; H01L 23/5226
See application file for complete search history.

(56) References Cited

U.S. PATENT DOCUMENTS

| 7,833,898 | B2 * | 11/2010 | Lee | .......................... H01L 45/04 |
| | | | | 438/618 |
| 8,107,272 | B2 | 1/2012 | Sato | |
| 8,208,290 | B2 | 6/2012 | Rao et al. | |
| 8,325,508 | B2 | 12/2012 | Kawai et al. | |

(Continued)

FOREIGN PATENT DOCUMENTS

KR       10-0979350 B1     8/2010

*Primary Examiner* — Kyoung Lee
*Assistant Examiner* — Christina A Sylvia
(74) *Attorney, Agent, or Firm* — Harness, Dickey & Pierce, P.L.C.

(57) ABSTRACT

A semiconductor device includes a gate structure on a substrate, source and drain contacts respectively on opposite sides of the gate structure and connected to the substrate, a magnetic tunnel junction connected to the drain contact, a first conductive line connected to the source contact, and a second conductive line connected to the first conductive line through a first via contact. The second conductive line is distal to the substrate in relation to the first conductive line. The first and second conductive lines extend in parallel along a first direction. The first and second conductive lines have widths in a second direction intersecting the first direction. The widths of the first and second conductive lines are the same. The first via contact is aligned with the source contact along a third direction perpendicular to a top surface of the substrate.

20 Claims, 19 Drawing Sheets

(56) References Cited

U.S. PATENT DOCUMENTS

| | | |
|---|---|---|
| 9,230,647 B2 | 1/2016 | Tsai et al. |
| 9,257,165 B2 | 2/2016 | Andre |
| 9,496,314 B1 | 11/2016 | Lu et al. |
| 9,721,634 B2 | 8/2017 | Zhu et al. |
| 9,768,183 B2 | 9/2017 | Akimoto et al. |
| 9,818,933 B2 | 11/2017 | Wang |
| 2008/0185568 A1* | 8/2008 | Kwon ................ H01L 27/24 257/2 |
| 2009/0302362 A1* | 12/2009 | Kikuchi ............. H01L 27/04 257/295 |
| 2010/0103718 A1* | 4/2010 | Asao ................ G11C 11/1659 365/148 |
| 2011/0037108 A1* | 2/2011 | Sugiura ............. H01L 43/08 257/295 |
| 2014/0264222 A1* | 9/2014 | Yang ............... H01L 21/26513 257/2 |
| 2015/0090949 A1* | 4/2015 | Chang .............. H01L 45/1253 257/4 |
| 2016/0254318 A1 | 9/2016 | Lu et al. |
| 2016/0268499 A1* | 9/2016 | You ................. H01L 43/12 |
| 2017/0069826 A1* | 3/2017 | Wang ............... G11C 11/1659 |
| 2017/0084820 A1* | 3/2017 | Tan ................. H01L 43/08 |

\* cited by examiner

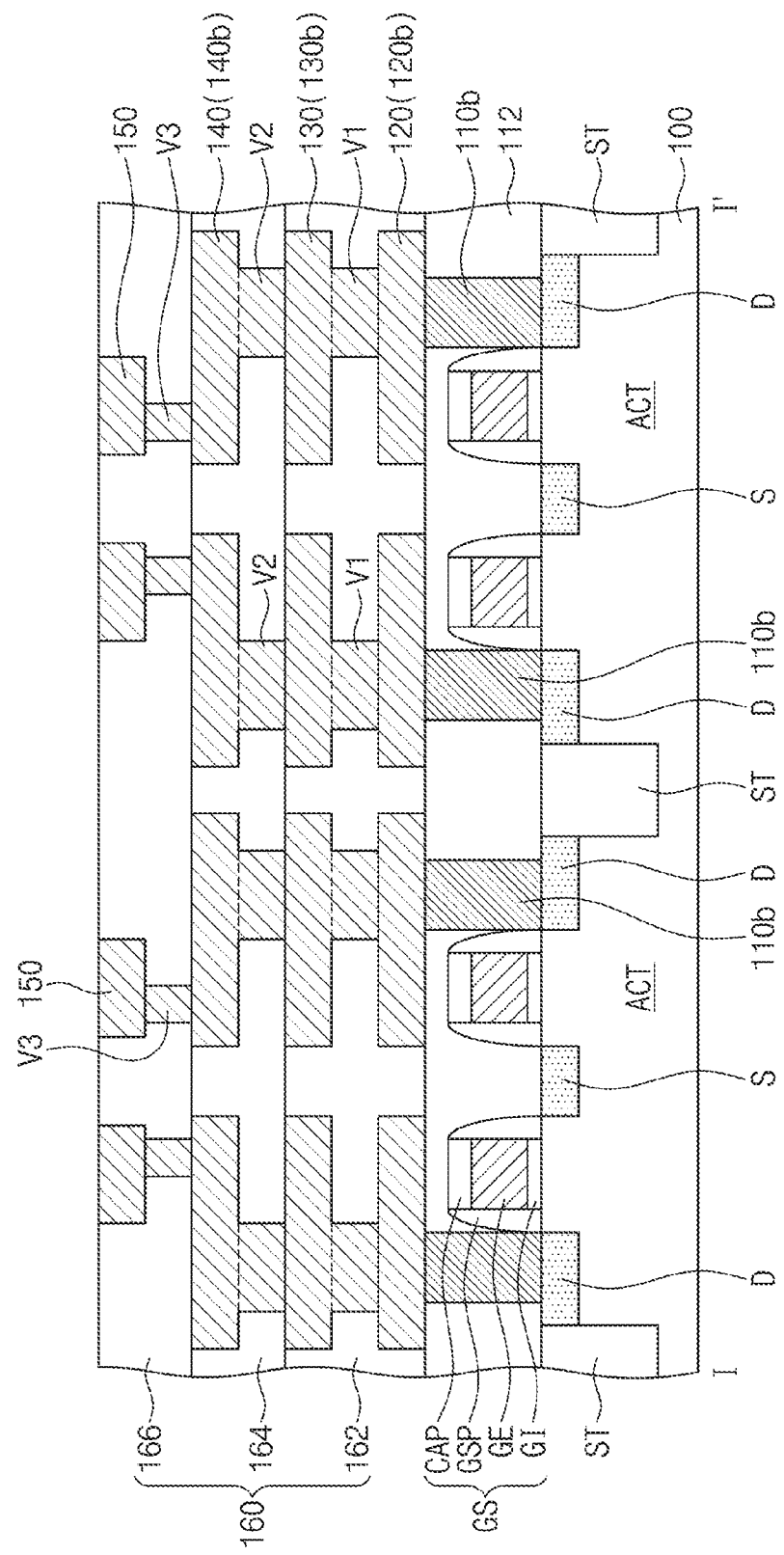

SEMICONDUCTOR DEVICES

CROSS-REFERENCE TO RELATED APPLICATION

This U.S. nonprovisional application claims priority under 35 U.S.C § 119 to Korean Patent Application No. 10-2018-0046175 filed on Apr. 20, 2018 in the Korean Intellectual Property Office, the entire contents of which are hereby incorporated by reference.

BACKGROUND

Inventive concepts relate to semiconductor devices, and more particularly, to magnetic memory device including a magnetic tunnel junction.

As electronic products trend toward higher processing speeds and/or low power consumption, semiconductor memory devices incorporated in the electronic products are increasingly associated with higher processing speeds and low operating voltages. To this end, magnetic memory devices have been developed as semiconductor memory devices. Since magnetic memory devices operate at high processing speeds and have nonvolatile characteristics, they have attracted considerable attention as the next-generation semiconductor memory devices.

In general, magnetic memory devices may include magnetic tunnel junctions (MTJ). A magnetic tunnel junction may include two magnetic structures and an insulation layer interposed therebetween. The resistance of the magnetic tunnel junction may vary depending on magnetization directions of the two magnetic structures. For example, the magnetic tunnel junction may have high resistance when the magnetization directions of the two magnetic structures are anti-parallel and may have low resistance when the magnetization directions of the two magnetic structures are parallel. A magnetic memory device that includes the magnetic tunnel junction may write and read data using the difference between the high and low resistances of the magnetic tunnel junction.

With the remarkable advance in electronic industry, there is an increasing demand for higher integration and/or lower power consumption of magnetic memory devices. Accordingly, many studies have been conducted to meet these demands.

SUMMARY

Some example embodiments of inventive concepts provide semiconductor devices with improved electrical characteristics.

Some example embodiments of inventive concepts provide easily-fabricated semiconductor devices.

According to some example embodiments of inventive concepts, a semiconductor device, may comprise a gate structure on a substrate, a source contact and a drain contact on opposite sides of the gate structure, respectively, a first conductive line connected to the source contact, and a second conductive line connected to the first conductive line through a first via contact. The source contact and the drain contact may each be connected to the substrate. A magnetic tunnel junction may be connected to the drain contact. The second conductive line may be distal from the substrate in relation to the first conductive line. The first conductive line and the second conductive line may extend in parallel to each other along a first direction. Each conductive line of the first conductive line and the second conductive line may have a width in a second direction intersecting the first direction, the width of the first conductive line and the width of the second conductive line being a common width. The first via contact may be aligned with the source contact along a third direction perpendicular to a top surface of the substrate.

According to some example embodiments of inventive concepts, a semiconductor device may include a substrate including a first active region and a second active region, a pair of first gate structures extending over the first active region, a pair of second gate structures extending over the second active region, a first source contact between the pair of first gate structures, the first source contact connected to the first active region, a second source contact between the pair of second gate structures, a first conductive line extending over the pair of first gate structures and the pair of second gate structures, and a second conductive line connected to the first conductive line through a plurality of first via contacts. The second source contact may be connected to the second active region. The first conductive line may be connected to the first source contact and the second source contact. The second conductive line may be distal the substrate in relation to the first conductive line. The first conductive line and the second conductive line may extend in parallel to each other along a first direction. One via contact of the plurality of first via contacts may be aligned with the first source contact along a direction perpendicular to a top surface of the substrate. Another via contact of the plurality of first via contacts may be aligned with the second source contact along the direction perpendicular to the top surface of the substrate.

BRIEF DESCRIPTION OF THE DRAWINGS

FIGS. 6A, 7A, 8A, and 9A illustrate cross-sectional views taken along line I-I' of FIG. 2, showing a method of fabricating a semiconductor device according to some example embodiments of inventive concepts.

DETAILED DESCRIPTION OF EMBODIMENTS

Some example embodiments of inventive concepts will be described below in detail with reference to the accompanying drawings.

Figure 1:
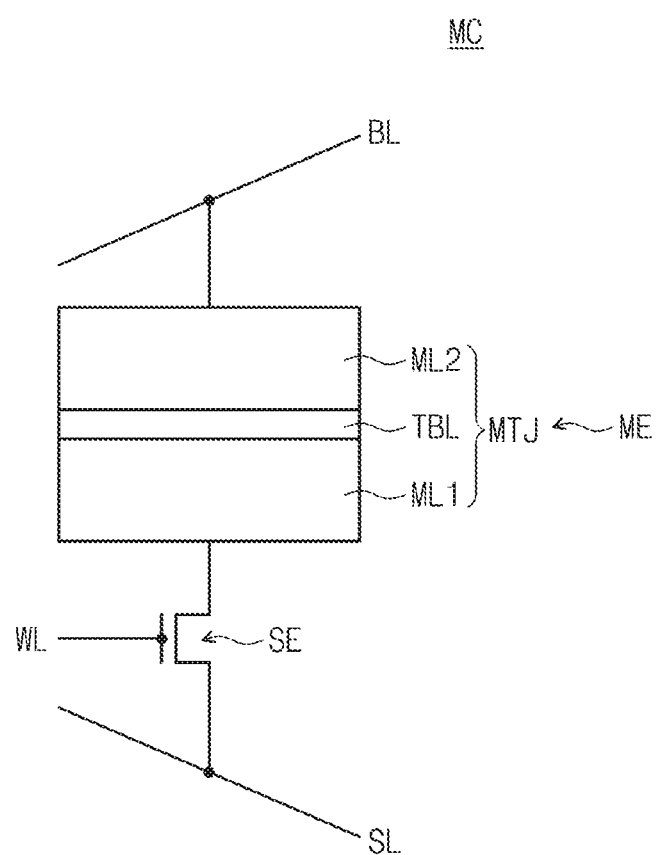
FIG. 1 illustrates a circuit diagram showing a unit memory cell of a semiconductor device according to some example embodiments of inventive concepts.

FIG. 1 illustrates a circuit diagram showing a unit memory cell of a semiconductor device according to some example embodiments of inventive concepts.

Referring to FIG. 1, a unit memory cell MC may include a memory element ME and a select element SE. The memory element ME and the select element SE may be electrically connected to each other in series. The memory element ME may be electrically connected between the select element SE and a bit line BL. The select element SE may be connected between the memory element ME and a source line SL, and controlled by a word line WL. The select element SE may include, for example, a bipolar transistor or a MOS field effect transistor.

The memory element ME may include a magnetic tunnel junction MTJ consisting of magnetic layers ML1 and ML2 spaced apart from each other and a tunnel barrier TBL between the magnetic layers ML1 and ML2. One of the magnetic layers ML1 and ML2 may be a reference layer having a magnetization direction that is fixed regardless of an external magnetic field under a normal use environment. The other of the magnetic layers ML1 and ML2 may be a free layer whose magnetization direction is freely changed by the external magnetic field. The magnetic tunnel junction MTJ may have an electrical resistance whose value is much greater in case that the magnetization directions of the reference and free layers are anti-parallel to each other than in case that the magnetization directions of the reference and free layers are parallel to each other. For example, the electrical resistance of the magnetic tunnel junction MTJ may be controlled by changing the magnetization direction of the free layer. The memory element ME may use the difference in electrical resistance dependent on the magnetization directions of the reference and free layers, which mechanism may cause the unit memory cell MC to store data therein.

Figure 2:
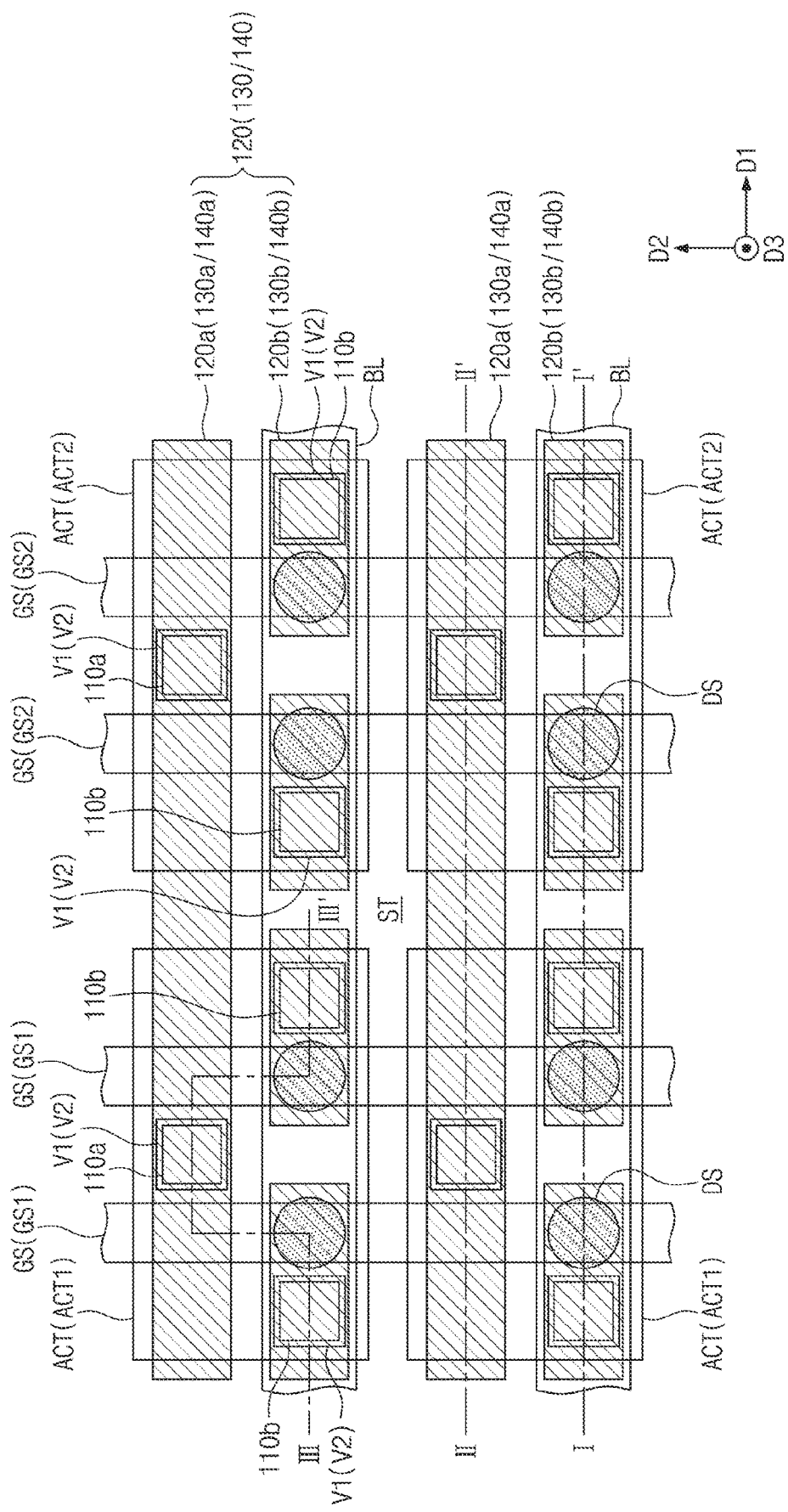
FIG. 2 illustrates a plan view showing a semiconductor device according to some example embodiments of inventive concepts.
Figure 3A:
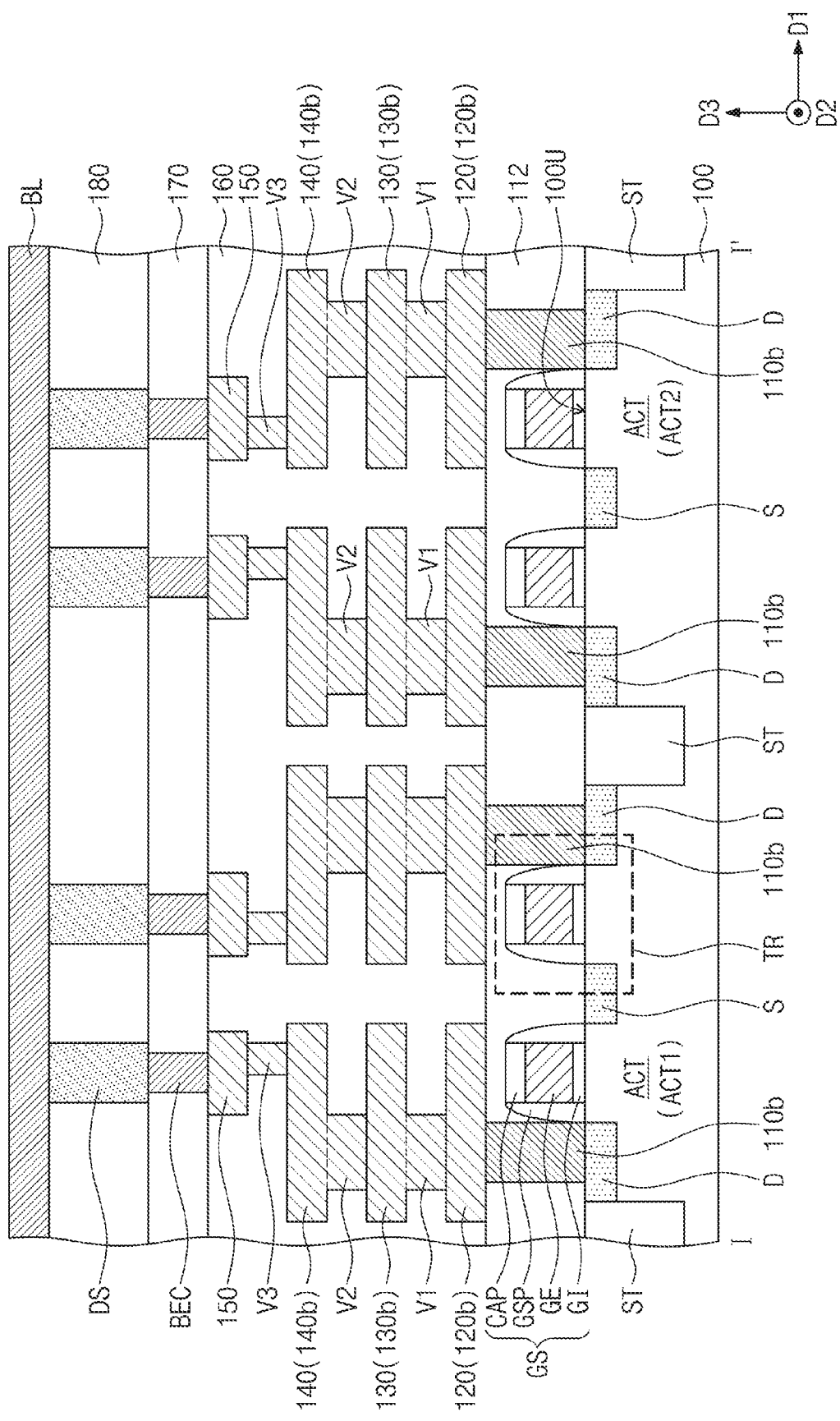
FIG. 3A illustrates a cross-sectional view taken along line I-I' of FIG. 2.
Figure 3B:
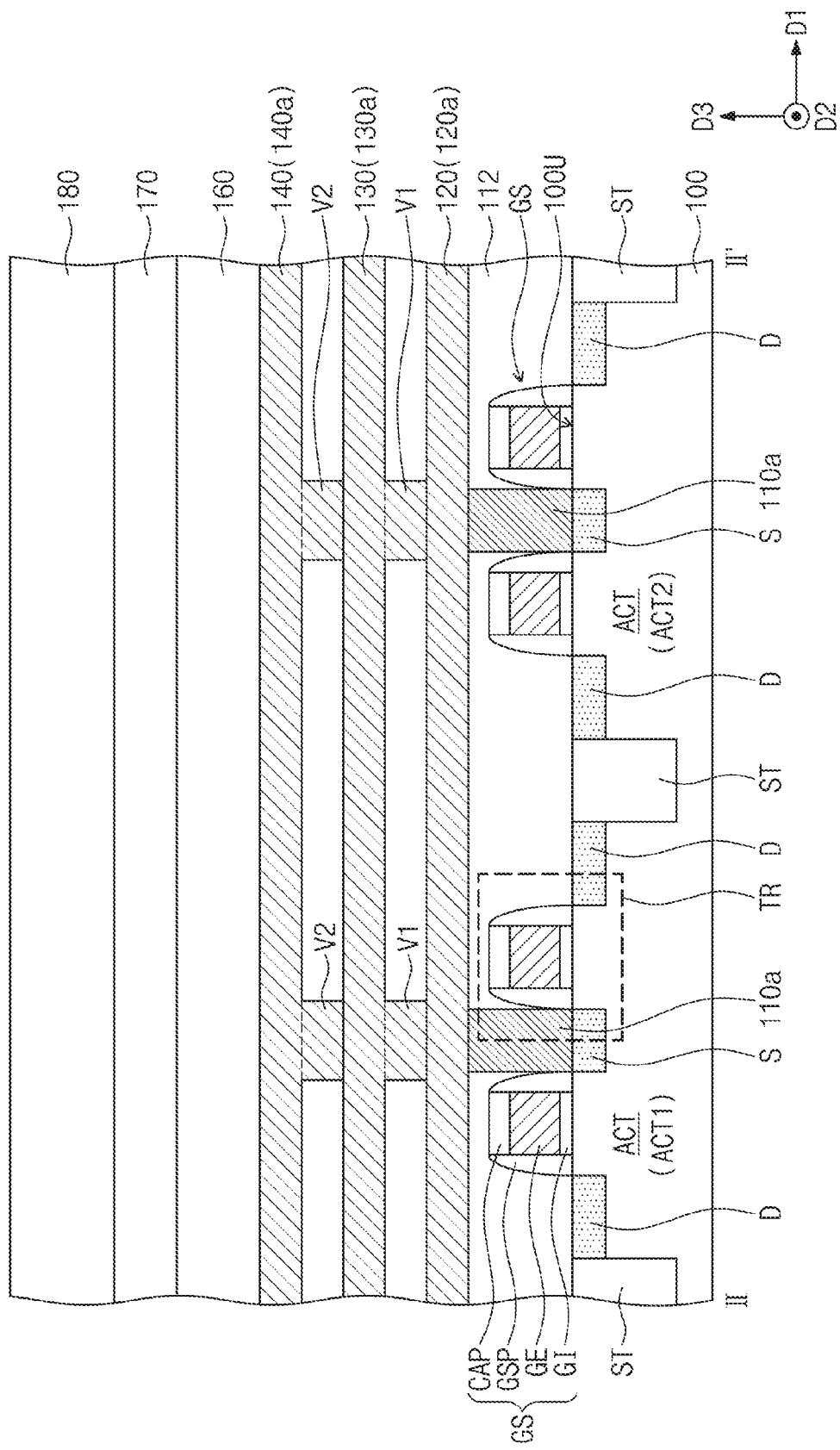
FIG. 3B illustrates a cross-sectional view taken along line II-II' of FIG. 2.
Figure 3C:
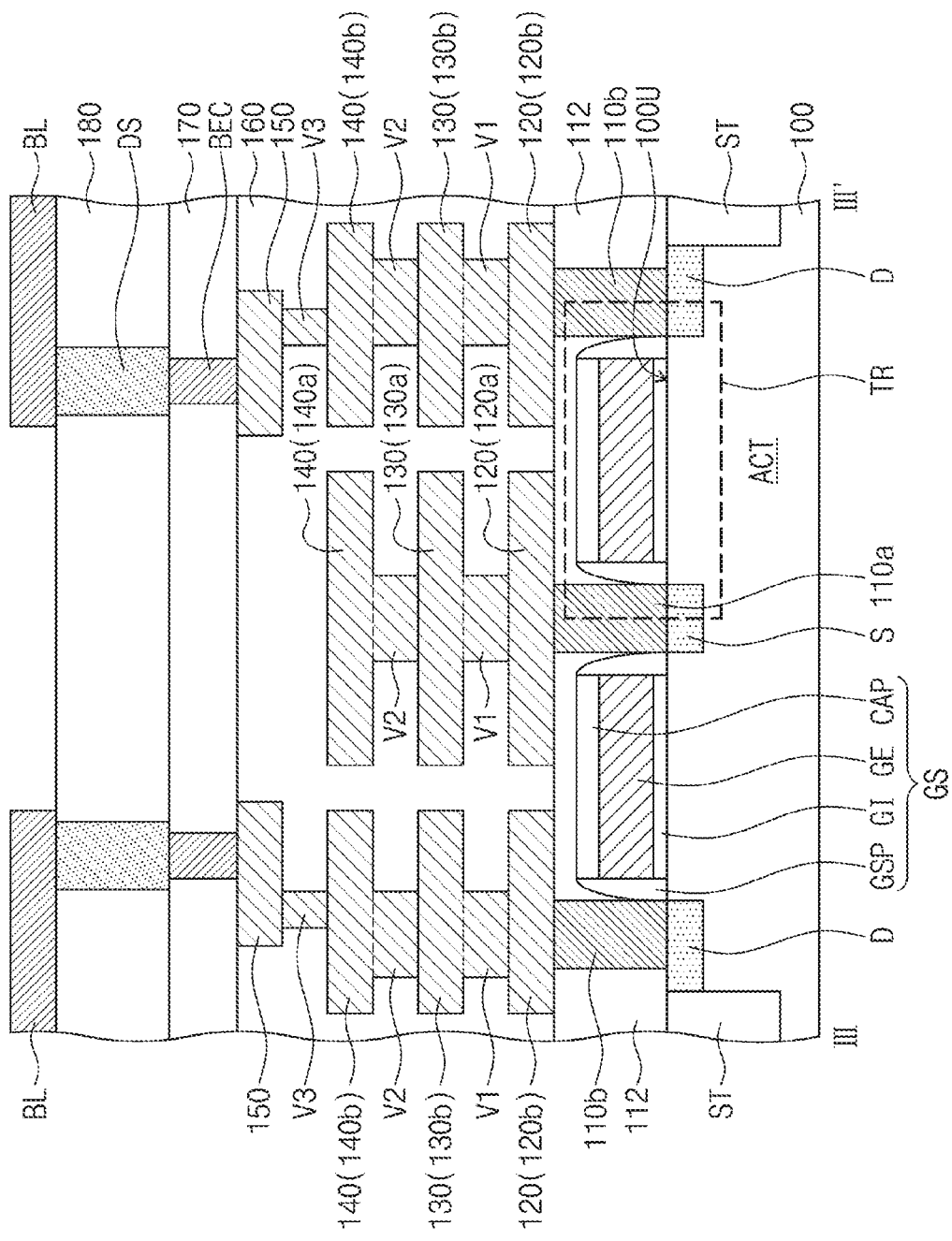
FIG. 3C illustrates a cross-sectional view taken along line III-III' of FIG. 2.
Figure 4:
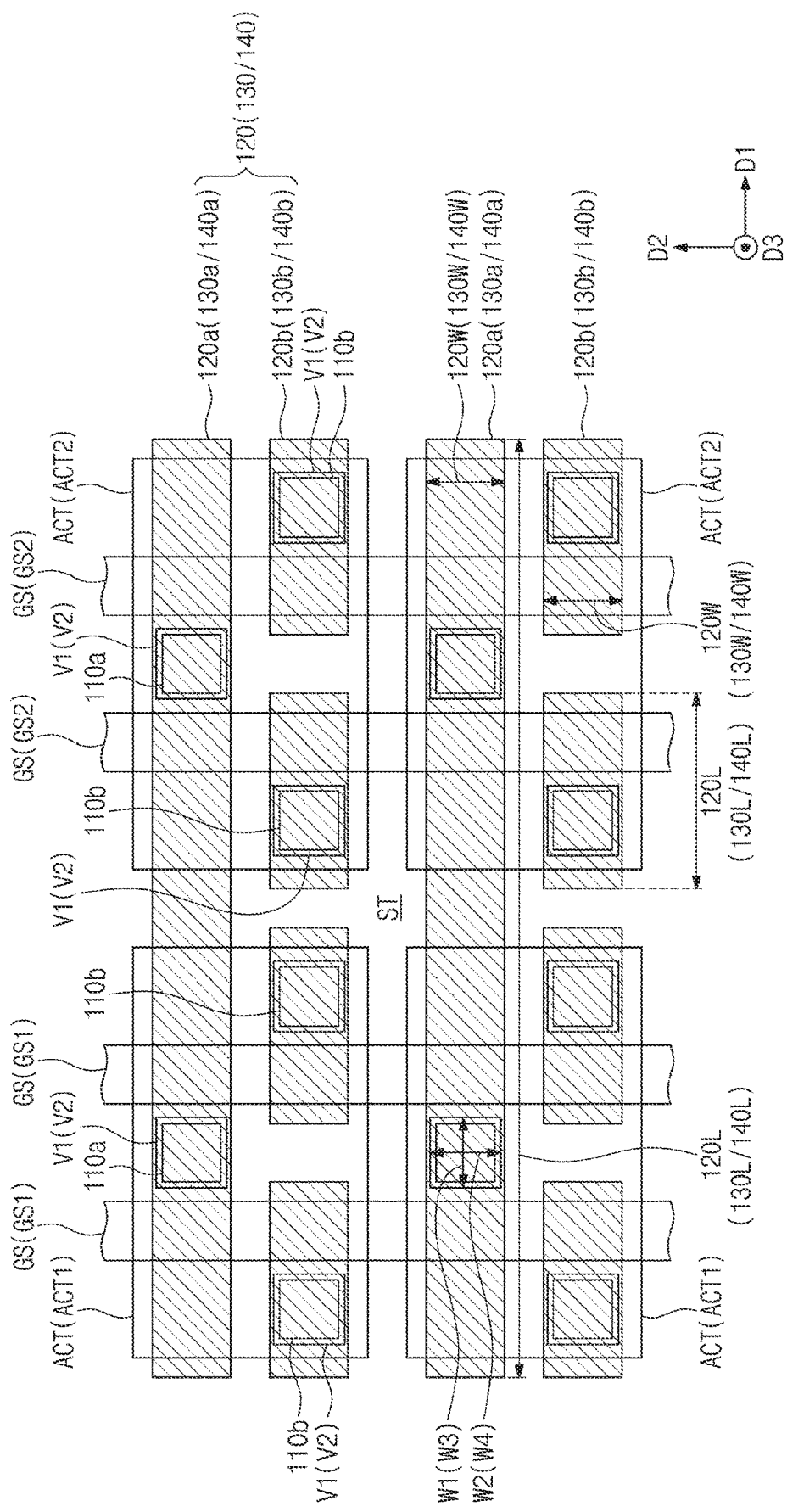
FIG. 4 illustrates a plan view showing a planar arrangement of first conductive lines, second conductive lines, and third conductive lines of FIG. 2.
Figure 5A:
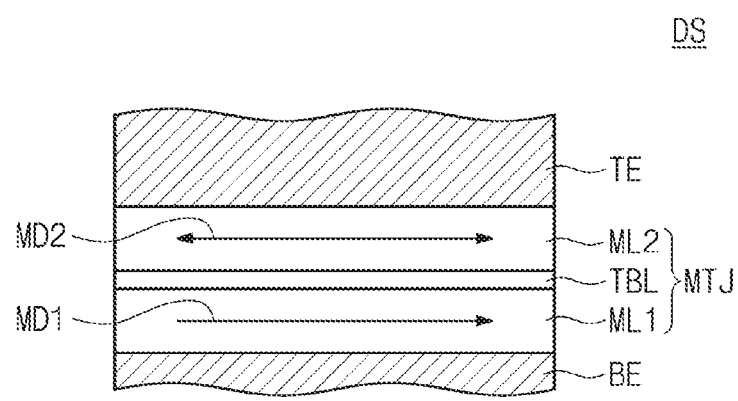
FIGS. 5A and 5B illustrate cross-sectional views showing examples of a data storage structure of FIG. 2.
Figure 5B:
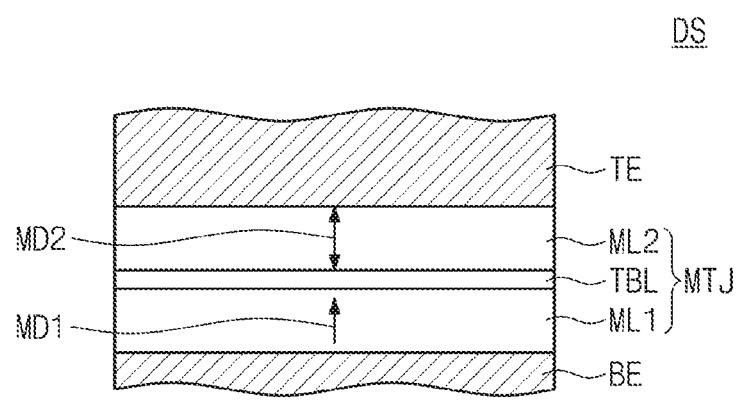
Figure 6A:
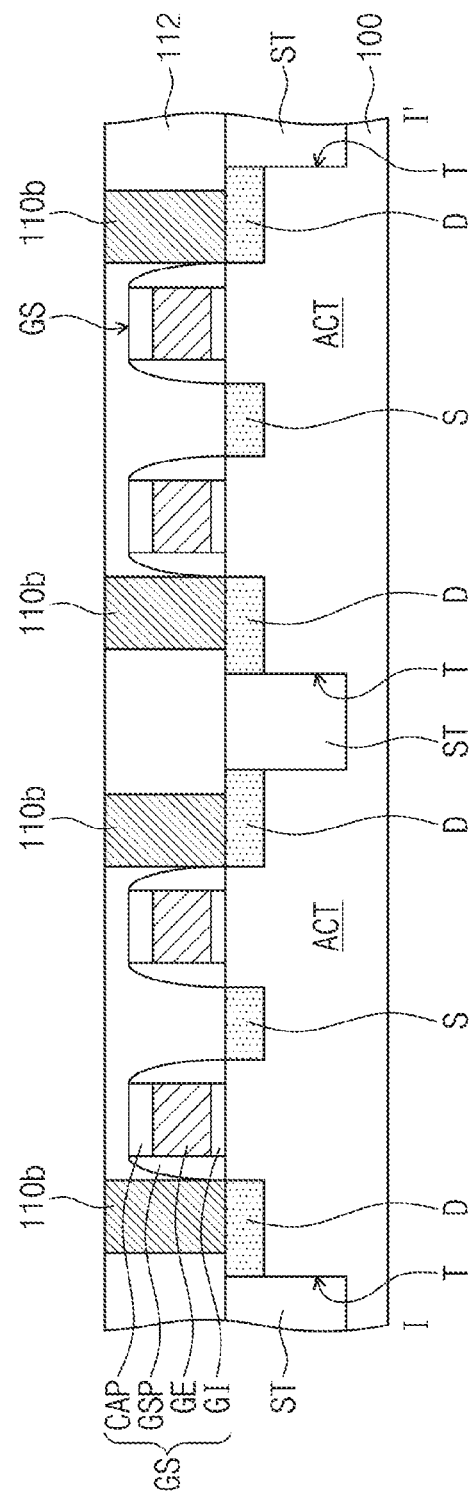
Figure 6B:
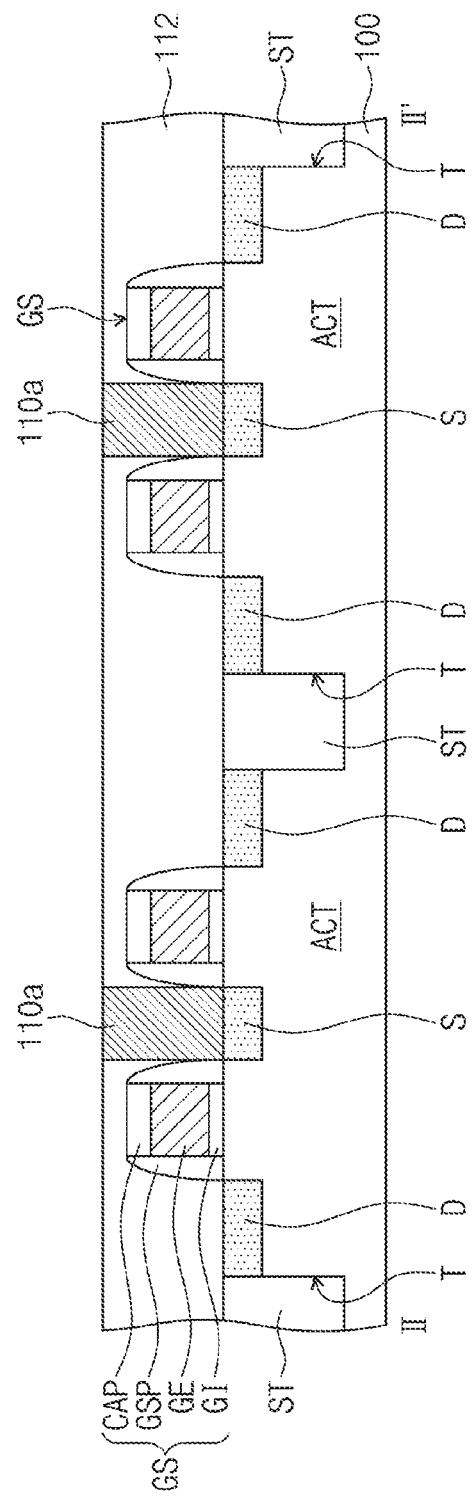
FIGS. 6B, 7B, 8B, and 9B illustrate cross-sectional views taken along line II-II' of FIG. 2, showing a method of fabricating a semiconductor device according to some example embodiments of inventive concepts.
Figure 6C:
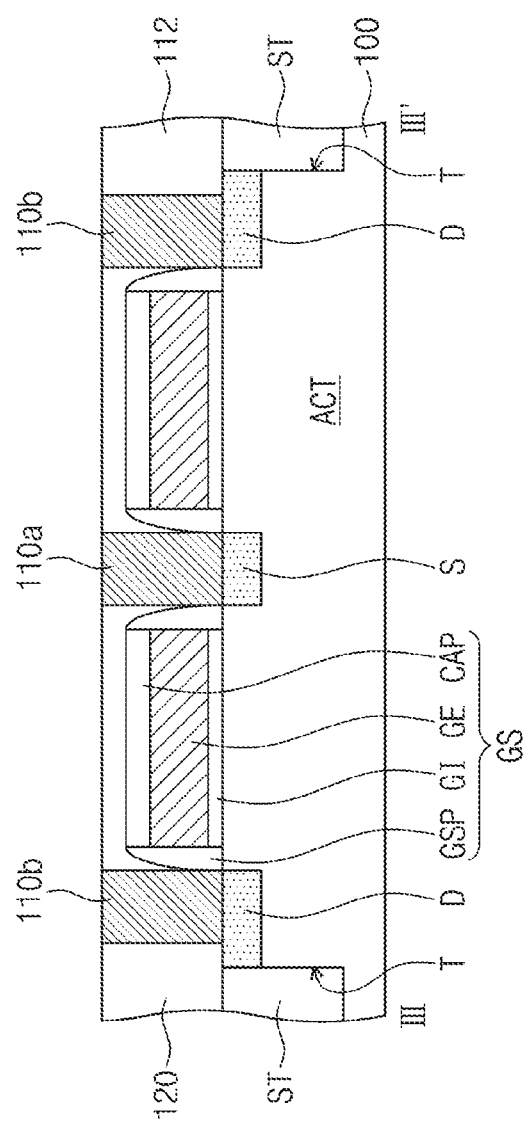
FIGS. 6C, 7C, 8C, and 9C illustrate cross-sectional views taken along line III-III' of FIG. 2, showing a method of fabricating a semiconductor device according to some example embodiments of inventive concepts.
Figure 7A:
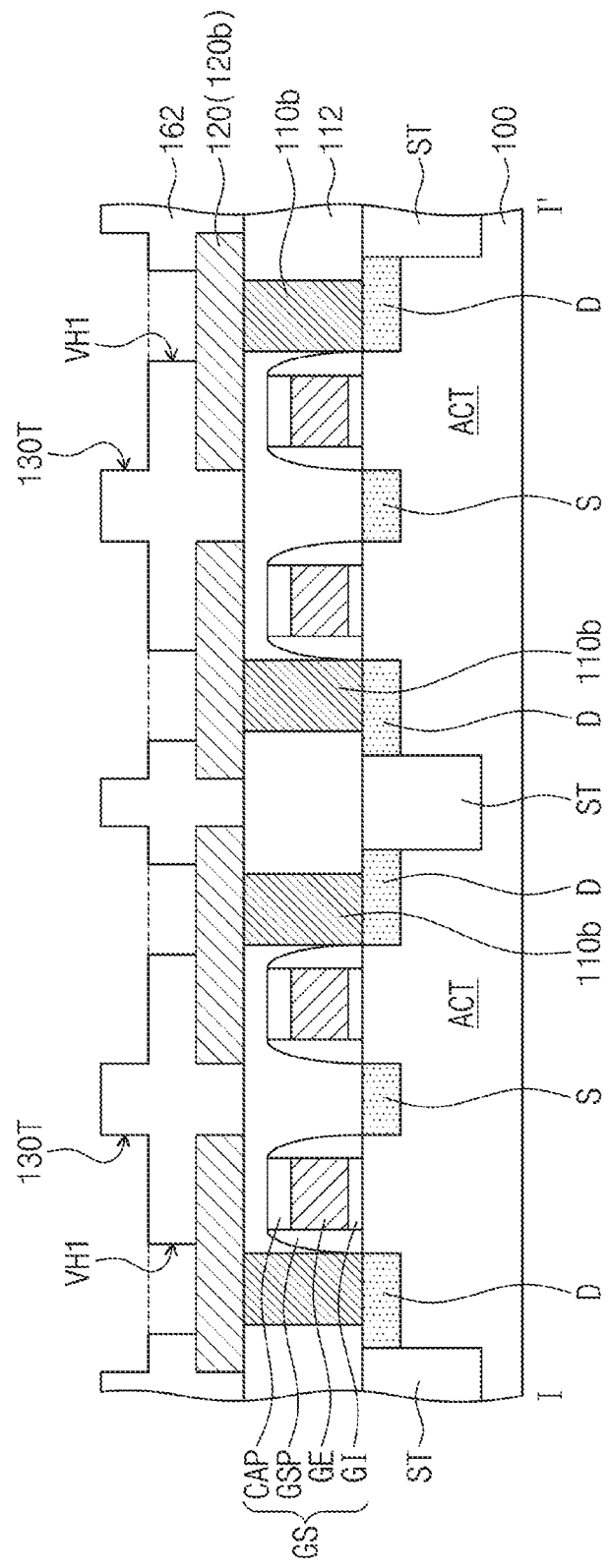
Figure 7B:
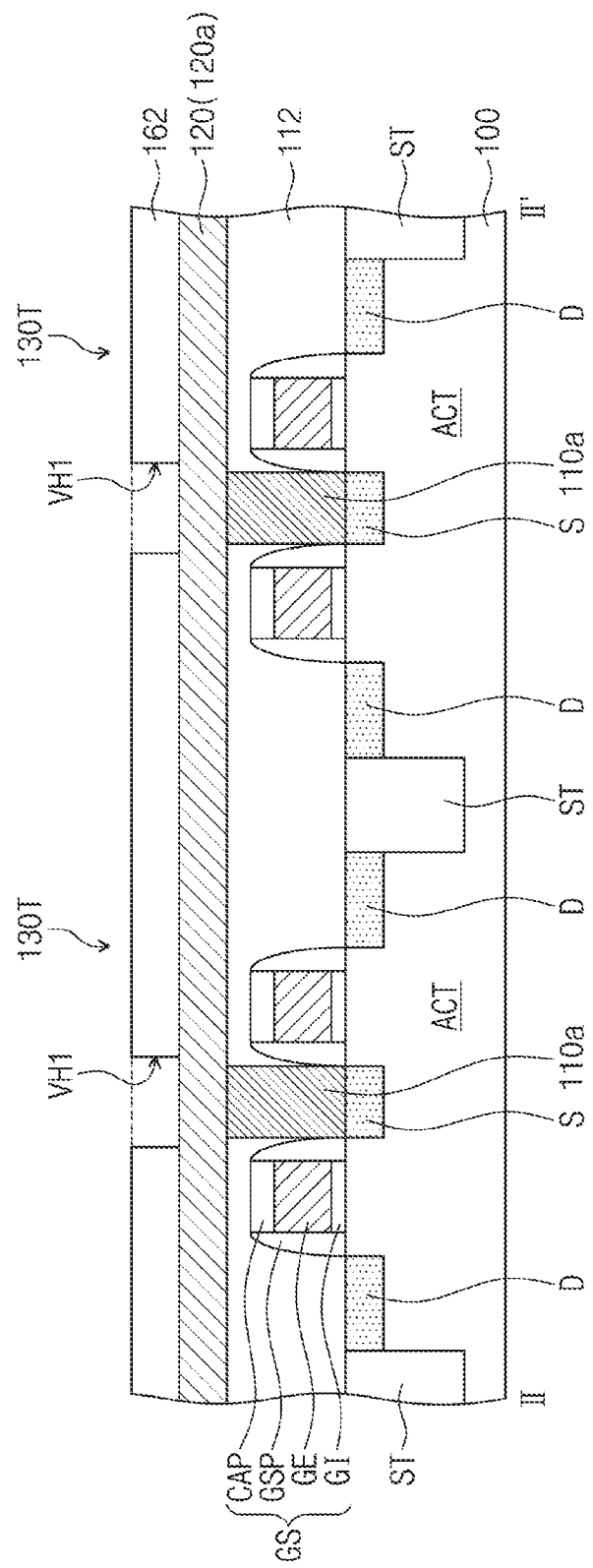
Figure 7C:
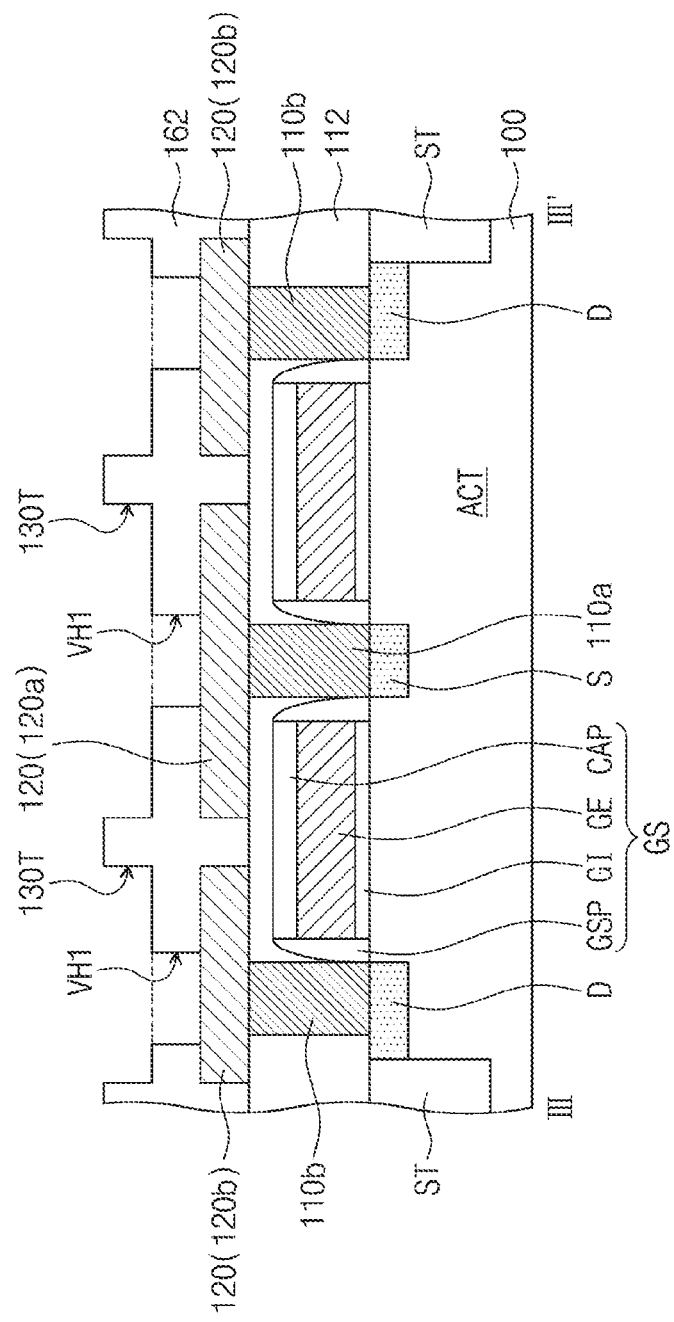
Figure 8A:
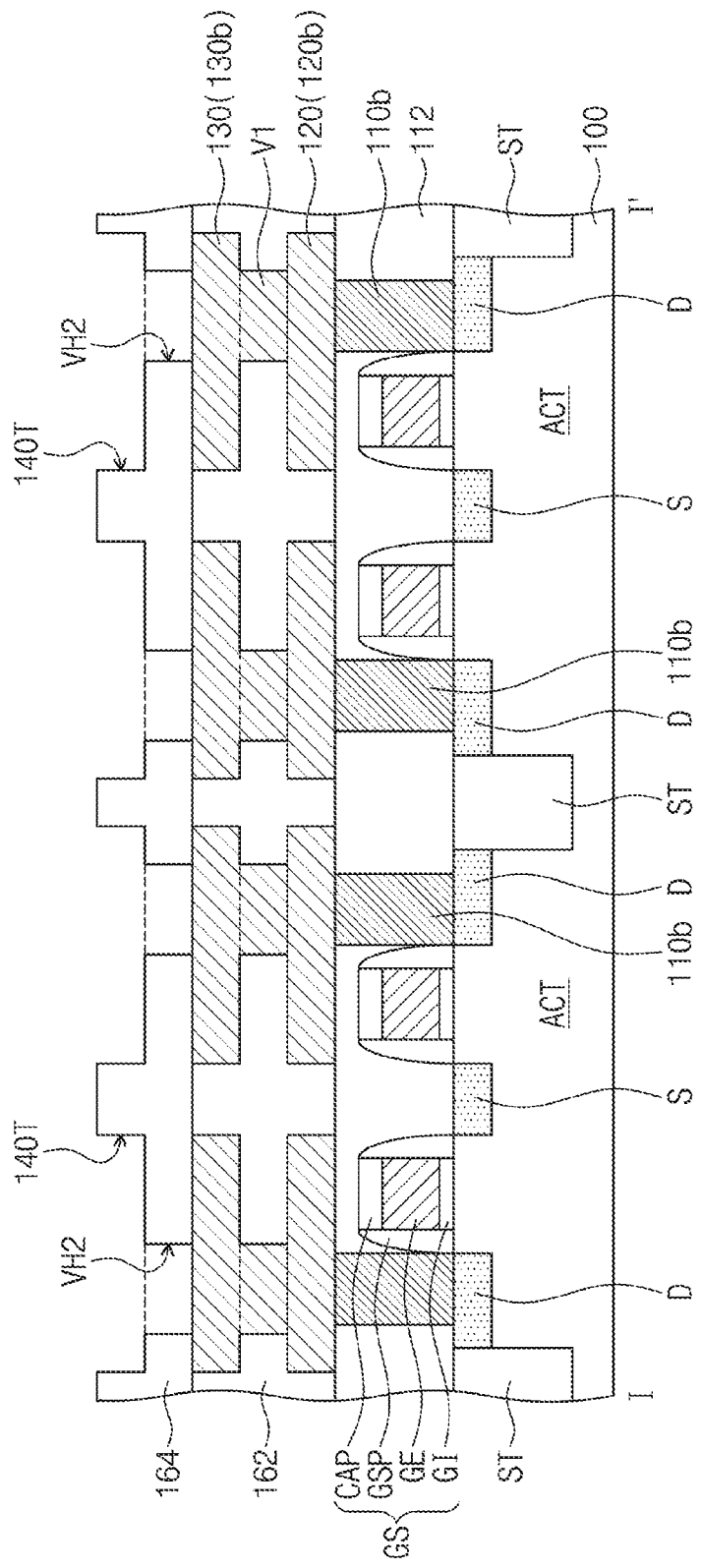
Figure 8B:
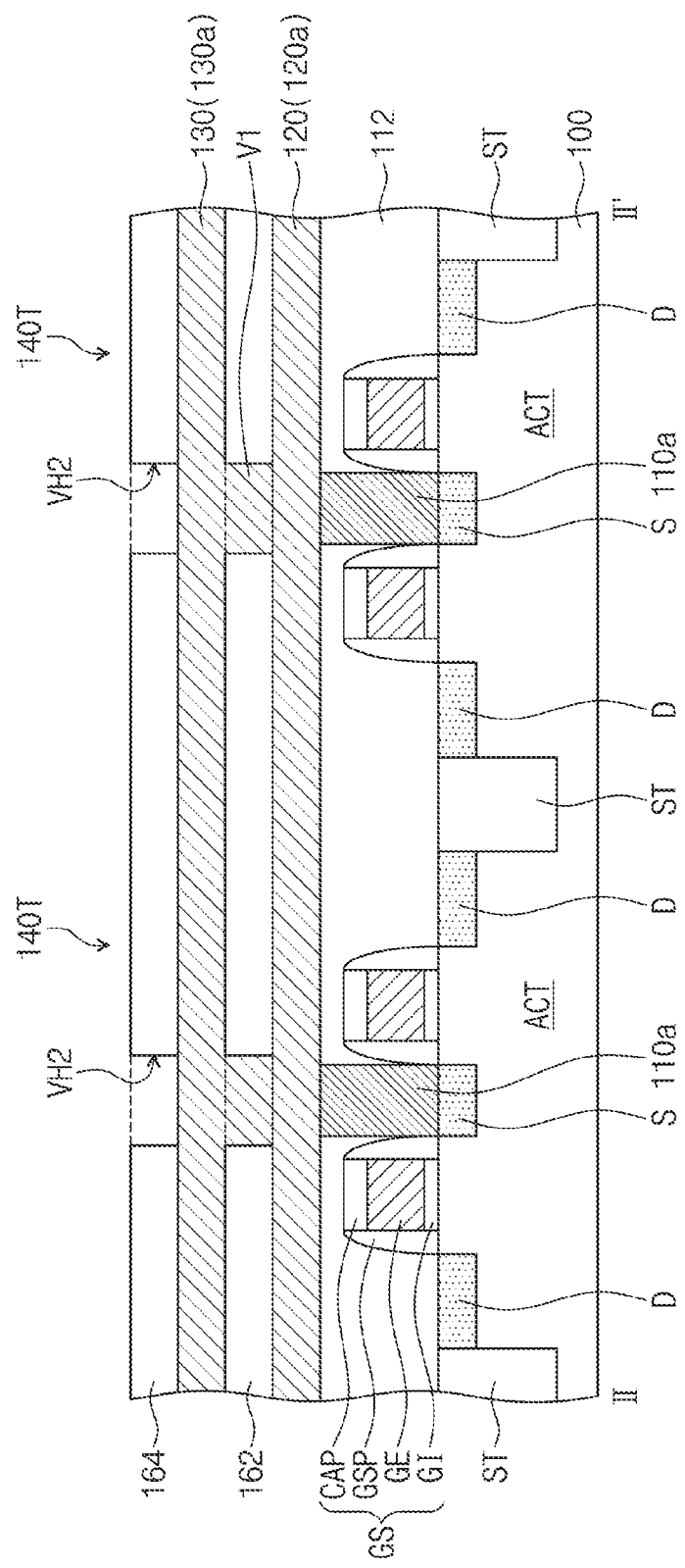
Figure 8C:
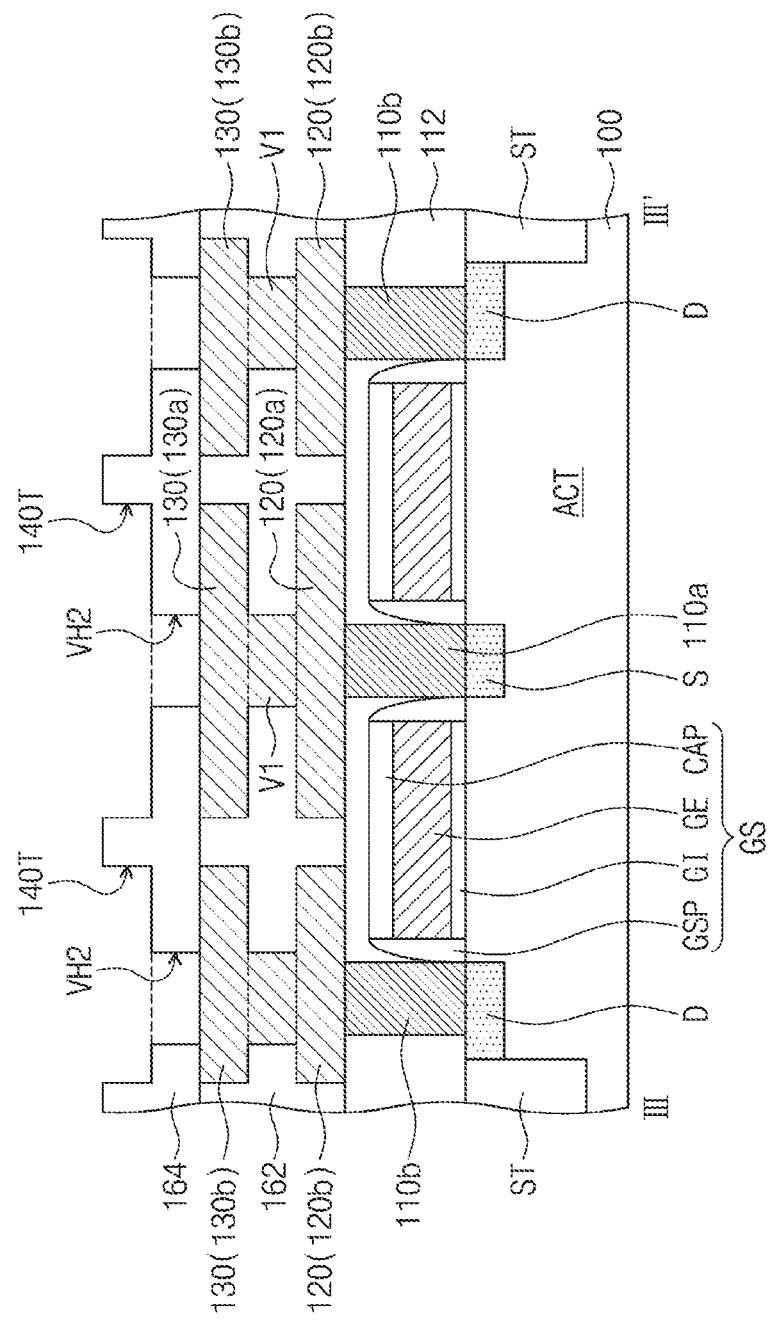
Figure 9B:
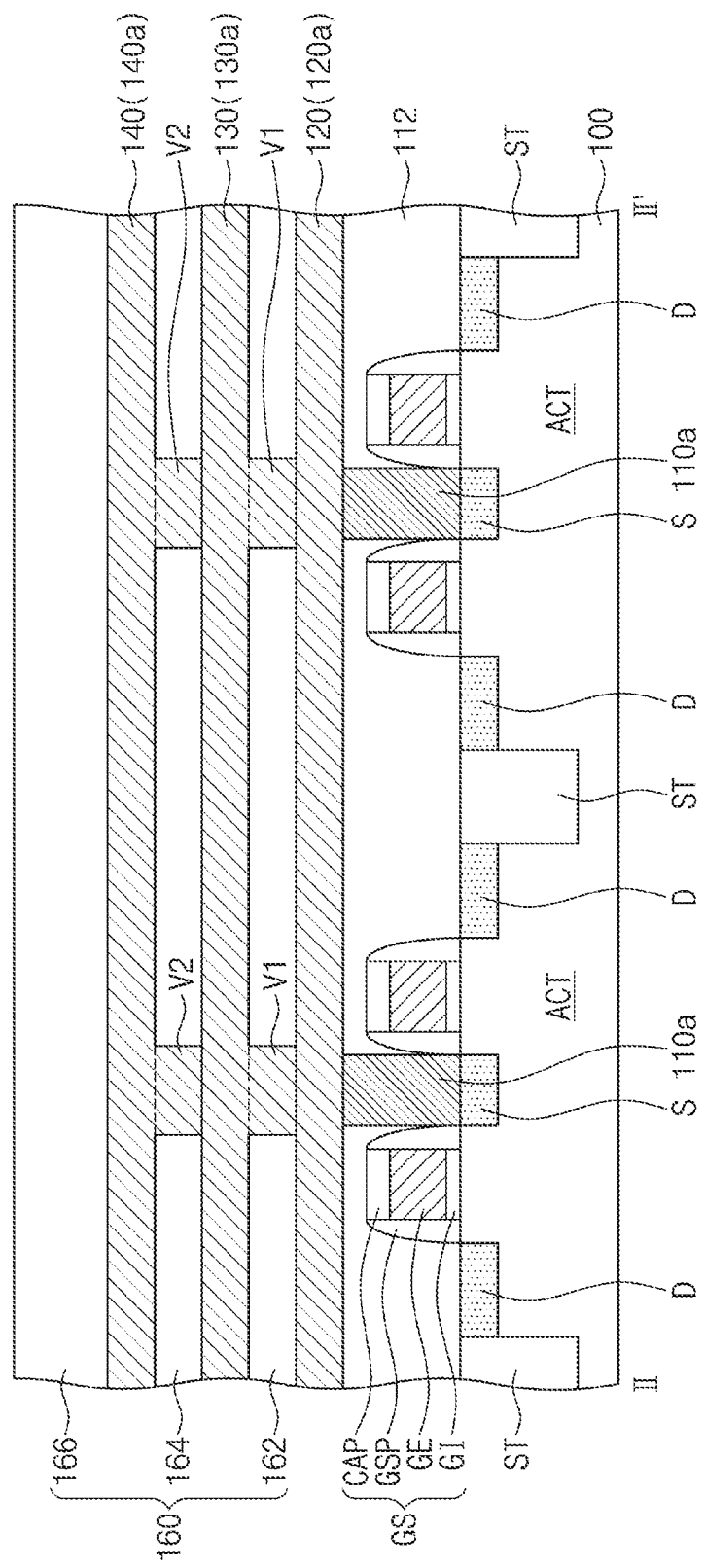
Figure 9C:
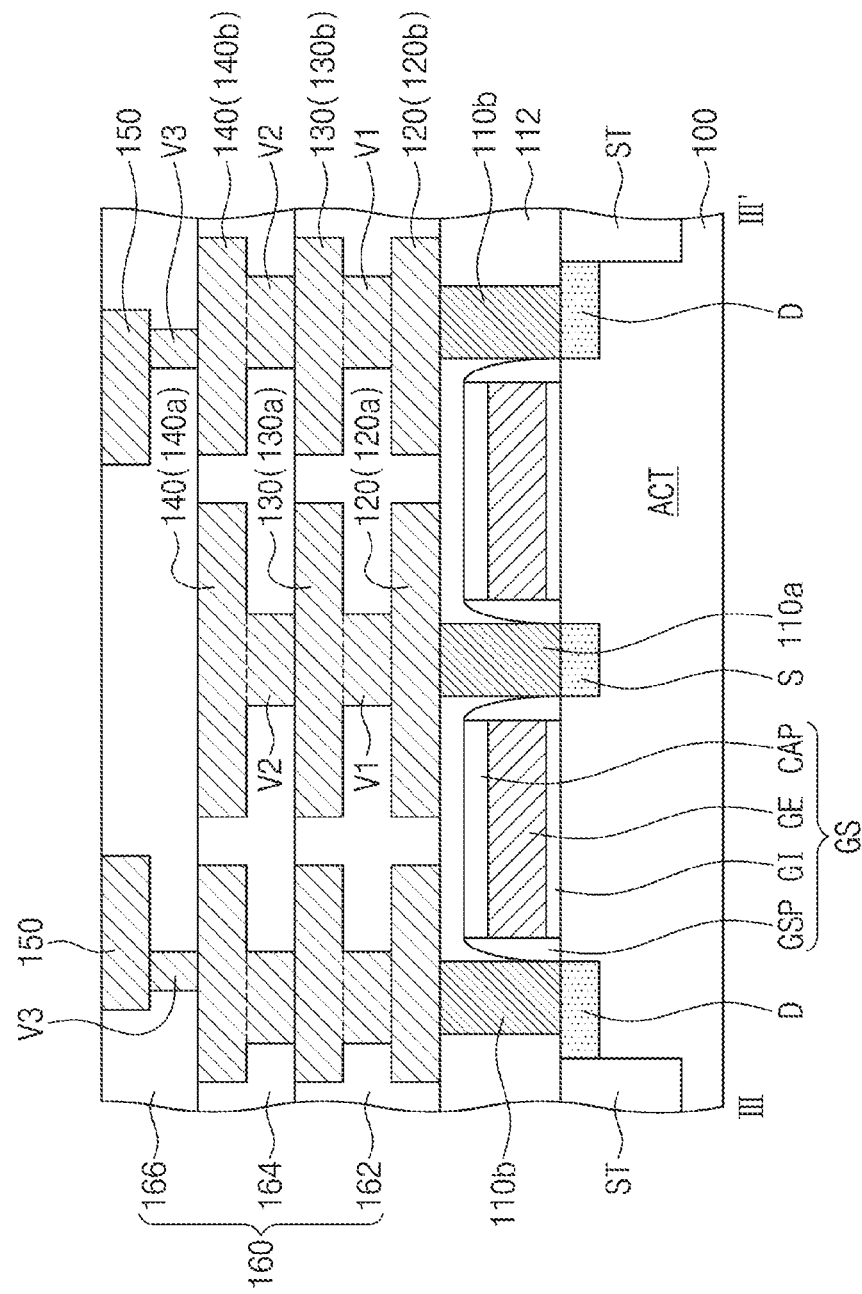

FIG. 2 illustrates a plan view showing a semiconductor device according to some example embodiments of inventive concepts. FIG. 3A illustrates a cross-sectional view taken along line I-I' of FIG. 2. FIG. 3B illustrates a cross-sectional view taken along line II-II' of FIG. 2. FIG. 3C illustrates a cross-sectional view taken along line III-III' of FIG. 2. FIG. 4 illustrates a plan view showing a planar arrangement of first conductive lines 120, second conductive lines 130, and third conductive lines 140 of FIG. 2. FIGS. 5A and 5B illustrate cross-sectional views showing examples of a data storage structure DS of FIG. 2.

Referring to FIGS. 2 and 3A to 3C, a substrate 100 may be provided to include a plurality of active regions ACT. The active regions ACT may be spaced apart from each other by a device isolation layer ST provided in the substrate 100. The active regions ACT may be spaced apart from each other in a first direction D1 and a second direction D2 intersecting the first direction D1. The first and second directions D1 and D2 may be parallel to a top surface 100U of the substrate 100. Each of the active regions ACT may protrude from the substrate 100 along a third direction D3 perpendicular to the top surface 100U of the substrate 100. The device isolation layer ST may be provided in the substrate 100 and may cover lateral surfaces of the active regions ACT. The substrate 100 may be or include, for example, a silicon substrate, a germanium substrate, or a silicon-on-insulator (SOI) substrate. The device isolation layer ST may include, for example, silicon oxide.

The substrate 100 may be provided thereon with a plurality of gate structures GS running across the active regions ACT, such that the semiconductor device shown in at least FIGS. 2 and 3A-3C includes a gate structure GS on substrate 100. The gate structures GS may be spaced apart from each other (e.g., isolated from direct contact with each other) in the first direction D1 and may extend in the second direction D2. Each of the gate structures GS may include a gate dielectric pattern GI, a gate electrode GE, and a gate capping pattern CAP that are sequentially stacked on the substrate 100. The gate electrode GE may extend in the second direction D2 and run across corresponding ones of the active regions ACT. The gate dielectric pattern GI may extend in the second direction D2 along a bottom surface of the gate electrode GE, and the gate capping pattern CAP may extend in the second direction D2 along a top surface of the gate electrode GE. Each of the gate structures GS may further include gate spacers GSP on lateral surfaces of the gate electrode GE. The gate spacers GSP may extend in the second direction D2 along the lateral surfaces of the gate electrode GE. The gate electrode GE may include one or more of doped semiconductor, metal, and conductive metal nitride. The gate dielectric pattern GI may include one or more of silicon oxide and silicon oxynitride, or alternatively may include a high-k dielectric layer whose dielectric constant is greater than that of silicon oxide. The gate capping pattern CAP and the gate spacers GSP may include one or more of silicon oxide, silicon nitride, and silicon oxynitride.

Each of the active regions ACT may be provided therein with a source region S and drain regions D. The drain regions D may be spaced apart from each other ("isolated from direct contact with each other") across the source region S. The source region S may be provided between a pair of gate structures GS running across the active regions ACT, and the drain regions D may be spaced apart from each other with the pair of gate structures GS interposed therebetween. For example, the source region S may be provided on one side of each of the pair of gate structures GS, and the drain region D may be provided on other side of each of the pair of gate structures GS The source region S may include impurities whose conductivity is the same as that of the drain regions D.

Each of the active regions ACT may be provided thereon with a source contact 110a and drain contacts 110b, which contacts 110a and 110b are connected to the substrate 100. The pair of gate structures GS may be provided therebetween with the source contact 110a connected to the source region S. The drain contacts 110b may be spaced apart from each other with the pair of gate structures GS interposed therebetween and correspondingly connected to the drain regions D. Accordingly, the semiconductor device shown in at least FIGS. 2 and 3A-3C includes a source contact 110a and a drain contact 110b on opposite sides of the gate structure GS, respectively. As shown in at least FIGS. 3A-3C, the source contact 110a and the drain contact 110b may each be connected to the substrate 100. The source contact 110a and the drain contacts 110b may include one or more of doped semiconductor, metal, and conductive metal nitride. The source contact 110a and the drain contacts 110b may include, for example, tungsten. The substrate 100 may be provided thereon with a first interlayer dielectric layer 112 covering the gate structures GS, the source contact 110a, and the drain contacts 110b. The source contact 110a and the drain contacts 110b may have top surfaces substantially coplanar (e.g., coplanar within manufacturing tolerances and/or material tolerances) with that of the first interlayer dielectric layer 112. The top surfaces of the source contact 110a and the drain contacts 110b may be located at substantially the same height (e.g., the same height within manufacturing tolerances and/or material tolerances) as that of the top surface of the first interlayer dielectric layer 112.

In this description, the term "height" may be a distance in the third direction D3 from the substrate 100. The first interlayer dielectric layer 112 may include, for example, one or more of silicon oxide and silicon oxynitride.

First conductive lines 120 may be provided on the first interlayer dielectric layer 112. The first conductive lines 120 may extend in the first direction D1 and run across the gate structures GS. The first conductive lines 120 may be spaced apart from each other in the second direction D2. The first conductive lines 120 may be located at the same height from the substrate 100. The first conductive lines 120 may include a first source line 120a connected to the source contact 110a, and also include first drain lines 120b correspondingly connected to the drain contacts 110b. The first drain lines 120b may be spaced apart from each other in the first direction D1, and each of the first drain lines 120b may be spaced apart in the second direction D2 from the first source line 120a.

For example, referring to FIG. 4, the active regions ACT may include a first active region ACT1 and a second active region ACT2 that are spaced apart from each other (isolated from directly contacting each other) in the first direction D1. As shown in at least FIG. 4, the gate structures GS may include first gate structures GS1 (e.g., a pair of first gate structures GS1 as shown in FIG. 4) running across ("extending on," "extending over," "extending across," some combination thereof, or the like) the first active region ACT1 and second gate structures GS2 (e.g., a pair of second gate structures GS2 as shown in FIG. 4) running across ("extending on," "extending over," "extending across," some combination thereof, or the like) the second active region ACT2. On the first active region ACT1, a source contact 110a may be provided between the first gate structures GS1 (e.g., between the pair of first gate structures GS1 as shown in FIG. 4) and connected to the first active region ACT1; such a source contact 110a may be referred to herein as a "first source contact." On the second active region ACT2, a source contact 110a may be provided between the second gate structures GS2 (e.g., between the pair of second gate structures GS2 as shown in FIG. 4) and connected to the second active region ACT2; such a source contact 110a may be referred to herein as a "second source contact." As shown in FIG. 4, a first conductive line 120 may extend over at least some (e.g., a pair of) first gate structures GS1 and at least some (e.g., a pair of) second gate structures GS2 and may be connected to the "first source contact" and the "second source contact." Referring back to FIG. 3B, a second conductive line 130 may be connected to the first conductive line 120 through a plurality of first via contacts V1, and the second via contacts V2 may be correspondingly aligned with the first via contacts V1 along the third direction D3.

The first source line 120a may extend in the first direction D1, and may run across the first active region ACT1 and the second active region ACT2. The first source line 120a may run across the first gate structures GS1 and the second gate structures GS2. The first source line 120a may be connected to the source contact 110a on the first active region ACT1 and to the source contact 110a on the second active region ACT2. The drain contacts 110b on the first active region ACT1 and the second active region ACT2 may be connected to corresponding first drain lines 120b. The corresponding first drain lines 120b may be spaced apart from each other in the first direction D1, and each of the corresponding first drain lines 120b may be spaced apart in the second direction D2 from the first source line 120a.

Each of the first conductive lines 120 may have a length 120L in the first direction D1 and a width 120W in the second direction D2. The width 120W of the first source line 120a may be the same as the width 120W of each of the first drain lines 120b. The length 120L of the first source line 120a may be greater than the length 120L of each of the first drain lines 120b. The first conductive lines 120 may include one or more of metal and conductive metal nitride. The first conductive lines 120 may include, for example, copper.

Referring back to FIGS. 2 and 3A to 3C, second conductive lines 130 may be provided on the first conductive lines 120. The second conductive lines 130 may be located at the same height from the substrate 100. The second conductive lines 130 may be positioned at a height from the substrate 100 greater than that of the first conductive lines 120. Restated, and as shown in at least FIGS. 3A-3C, a second conductive line 130 may be distal from the substrate 100 in relation to a first conductive line 120. The second conductive lines 130 may extend in the first direction D1 and run across the gate structures GS. The second conductive lines 130 may be spaced apart from each other in the second direction D2. First via contacts V1 may be provided between the first conductive lines 120 and the second conductive lines 130, such that a second conductive line 130 is connected to a first conductive line 120 through a first via contact V1. The first via contacts V1 may be located at the same height from the substrate 100, and at a height between that of the first conductive lines 120 and that of the second conductive lines 130. Each of the second conductive lines 130 may be connected to a corresponding one of the first conductive lines 120 through one or more corresponding first via contacts V1. As shown in at least FIG. 3B, the first conductive lines 120 and the second conductive lines 130 may extend in parallel to each other along a first direction (e.g., D1). As further shown in at least FIG. 3B, one first via contact V1 is aligned with the "first source contact" along the third direction D3 and another first via contact V1 is aligned with the "second source contact" along the third direction D3. In addition, as further shown in at least FIG. 3B, one second via contact V2 is aligned with the "first source contact" along the third direction D3 and another second via contact V2 is aligned with the "second source contact" along the third direction D3.

The second conductive lines 130 may include a second source line 130a connected to the first source line 120a of the first conductive lines 120, and also include second drain lines 130b correspondingly connected to the first drain lines 120b of the first conductive lines 120. The second drain lines 130b may be spaced apart from each other in the first direction D1, and each of the second drain lines 130b may be spaced apart in the second direction D2 from the second source line 130a. The second source line 130a may be connected to the first source line 120a through corresponding first via contacts V1. Each of the second drain lines 130b may be connected to a corresponding one of the first drain lines 120b through a corresponding one of the first via contacts V1.

For example, referring back to FIG. 4, the second source line 130a may extend in the first direction D1 along the first source line 120a. When viewed in plan, the second source line 130a may overlap the first source line 120a. As shown in FIG. 3B, the second source line 130a may be provided on the first source line 120a and may extend in parallel to the first source line 120a. The second source line 130a may extend in the first direction D1, and may run across the first active region ACT1 and the second active region ACT2. The second source line 130a may run across the first gate structures GS1 and the second gate structures GS2.

The second source line 130a may be connected to the first source line 120a through a pair of first via contacts V1. When viewed in plan, one of the pair of first via contacts V1 may be provided to overlap the source contact 110a on the first active region ACT1. When viewed in plan, the other of the pair of first via contacts V1 may be provided to overlap the source contact 110a on the second active region ACT2. For example, as shown in FIG. 3B, one first via contact V1 of the pair of first via contacts V1 may be aligned in the third direction D3 with the source contact 110a on the first active region ACT1, and the other of the pair of first via contacts V1 may align in the third direction D3 with the source contact 110a on the second active region ACT2. The second source line 130a may be electrically connected in parallel to the first source line 120a through the pair of first via contacts V1.

Each of the second drain lines 130b may extend in the first direction D1 along a corresponding one of the first drain lines 120b. When viewed in plan, each of the second drain lines 130b may overlap a corresponding one of the first drain lines 120b. As shown in FIG. 3A, each of the second drain lines 130b may be provided on a corresponding one of the first drain lines 120b and may extend in parallel to the corresponding first drain line 120b. Each of the second drain lines 130b may be connected to a corresponding one of the first drain lines 120b through a corresponding one of the first via contacts V1. In some example embodiments, when viewed in plan, the corresponding first via contact V1 may be provided to overlap a corresponding one of the drain contacts 110b. For example, as shown in FIG. 3A, the first via contact V1 corresponding to one of the second drain lines 130b may align in the third direction D3 with a corresponding one of the drain contacts 110b.

Each of the second conductive lines 130 may have a length 130L in the first direction D1 and a width 130W in the second direction D2. The width 130W of the second source line 130a may be the same as the width 130W of each of the second drain lines 130b. The length 130L of the second source line 130a may be greater than the length 130L of each of the second drain lines 130b. In some example embodiments, the width 130W of the second source line 130a may be the same as the width 120W of the first source line 120a (i.e., the width 130W and the width 120W may be a common width), and the length 130L of the second source line 130a may be the same as the length 120L of the first source line 120a (i.e., the length 130L and the length 120L may be a common length). When viewed in plan, the second source line 130a may have substantially the same size and shape (e.g., the same size and shape within manufacturing tolerances and/or material tolerances) as those of the first source line 120a. In addition, the width 130W of each of the second drain lines 130b may be the same as the width 120W of each of the first drain lines 120b, and the length 130L of each of the second drain lines 130b may be the same as the length 120L of each of the first drain lines 120b. For example, when viewed in plan, each of the second drain lines 130b may have substantially the same size and shape (e.g., the same size and shape within manufacturing tolerances and/or material tolerances) as those of each of the first drain lines 120b.

Referring back to FIGS. 2 and 3A to 3C, the second conductive lines 130 may include one or more of metal and conductive metal nitride. The second conductive lines 130 may include, for example, copper. The first via contacts V1 may include (e.g., at least partially comprise) the same material as that of the second conductive lines 130, such that the first via contact V1 and the second conductive lines 130 include (e.g., at least partially comprise) a common material.

Each of the first via contacts V1 and its corresponding one of the second conductive lines 130 may be coupled to constitute a single body. For example, each of the first via contacts V1 and the corresponding second conductive line 130 may be in contact with each other without boundary therebetween. In some example embodiments, the second conductive lines 130 and the first via contacts V1 may include the same material as that of the first conductive lines 120.

Third conductive lines 140 may be provided on the second conductive lines 130. The third conductive lines 140 may be located at the same height from the substrate 100. The third conductive lines 140 may be positioned at a height from the substrate 100 greater than that of the second conductive lines 130. Restated, and as shown in at least FIGS. 3A-3C, a third conductive line 140 may be distal from the substrate 100 in relation to a second conductive line 130. The second conductive lines 130 may be positioned at a height from the substrate 100 between that of the first conductive lines 120 and that of the third conductive lines 140. The third conductive lines 140 may extend in the first direction D1 and run across the gate structures GS. The third conductive lines 140 may be spaced apart from each other in the second direction D2. Second via contacts V2 may be provided between the second conductive lines 130 and the third conductive lines 140, such that a third conductive line 140 is connected to a second conductive line 130 through a second via contact V2. The second via contacts V2 may be located at the same height from the substrate 100, and at a height between that of the second conductive lines 130 and that of the third conductive lines 140. Each of the third conductive lines 140 may be connected to a corresponding one of the second conductive lines 130 through one or more corresponding second via contacts V2. As shown in at least FIG. 3B, the first conductive lines 120, second conductive lines 130, and third conductive lines 140 may extend in parallel to each other along a first direction (e.g., D1).

The third conductive lines 140 may include a third source line 140a connected to the second source line 130a of the second conductive lines 130, and also include third drain lines 140b correspondingly connected to the second drain lines 130b of the second conductive lines 130. The third drain lines 140b may be spaced apart from each other in the first direction D1, and each of the third drain lines 140b may be spaced apart in the second direction D2 from the third source line 140a. The third source line 140a may be connected to the second source line 130a through corresponding second via contacts V2. Each of the third drain lines 140b may be connected to a corresponding one of the second drain lines 130b through a corresponding one of the second via contacts V2.

For example, referring back to FIG. 4, the third source line 140a may extend in the first direction D1 along the second source line 130a. When viewed in plan, the third source line 140a may overlap the second source line 130a. As shown in FIG. 3B, the third source line 140a may be provided on the second source line 130a, and may extend in parallel to the first and second source lines 120a and 130a. The third source line 140a may extend in the first direction D1, and may run across the first active region ACT1 and the second active region ACT2. The third source line 140a may run across the first gate structures GS1 and the second gate structures GS2.

The third source line 140a may be connected to the second source line 130a through a pair of second via contacts V2. When viewed in plan, one of the pair of second via contacts V2 may be provided to overlap the source contact 110a on the first active region ACT1. When viewed in plan, the other of the pair of second via contacts V2 may be provided to overlap the source contact 110a on the second active region ACT2. For example, as shown in FIG. 3B, one of the pair of second via contacts V2 may align ("may be aligned") in the third direction D3 with the source contact 110a on the first active region ACT1, and the other of the pair of second via contacts V2 may align in the third direction D3 with the source contact 110a on the second active region ACT2. The third source line 140a may be electrically connected in parallel to the first and second source lines 120a and 130a through the pair of second via contacts V2.

Each of the third drain lines 140b may extend in the first direction D1 along a corresponding one of the second drain lines 130b. When viewed in plan, each of the third drain lines 140b may overlap a corresponding one of the second drain lines 130b. As shown in FIG. 3A, each of the third drain lines 140b may be provided on a corresponding one of the second drain lines 130b and may extend in parallel to the corresponding second drain line 130b. Each of the third drain lines 140b may be connected to a corresponding one of the second drain lines 130b through a corresponding one of the second via contacts V2. In some example embodiments, when viewed in plan, the corresponding second via contact V2 may be provided to overlap a corresponding one of the drain contacts 110b. For example, as shown in FIG. 3A, the second via contact V2 corresponding to one of the third drain lines 140b may align in the third direction D3 with a corresponding one of the drain contacts 110b.

When viewed in plan, the second via contacts V2 may overlap corresponding first via contacts V1. For example, as shown in FIGS. 3A to 3C, each of the second via contacts V2 may align in the third direction D3 with a corresponding one of the first via contacts V1. Each first via contact V1 of the first via contacts V1 may have a first width W1 in the first direction D1 and a second width W2 in the second direction D2. Each second via contact V2 of the second via contacts V2 may have a third width W3 in the first direction D1, and the third width W3 may be the same (e.g., having a common magnitude) or substantially the same (e.g., the same within manufacturing tolerances and/or material tolerances) as the first width W1. Restated, the first width W1 and the third width W3 may be a substantially common width (e.g., a common ("same") width within manufacturing tolerances and/or material tolerances). Each second via contact V2 of the second via contacts V2 may have a fourth width W4 in the second direction D2, and the fourth width W4 may be the same or substantially the same (e.g., the same within manufacturing tolerances and/or material tolerances) as the second width W2. When viewed in plan, each of the second via contacts V2 may have the same size and shape as those of each of the first via contacts V1. Restated, and as shown in at least FIG. 2, when viewed in plan (e.g., as shown in FIG. 2), a second via contact V2 and a first via contact V1 may have a common size and shape.

Each of the third conductive lines 140 may have a length 140L in the first direction D1 and a width 140W in the second direction D2. The width 140W of the third source line 140a may be the same as the width 140W of each of the third drain lines 140b. The length 140L of the third source line 140a may be greater than the length 140L of each of the third drain lines 140b. In some example embodiments, the width 140W of the third source line 140a may be the same as the width 130W of the second source line 130a, and the length 140L of the third source line 140a may be the same as the length 130L of the second source line 130a. When viewed in plan, the third source line 140a may have substantially the same size and shape (e.g., the same size and shape within manufacturing tolerances and/or material tolerances) as those of the second source line 130a. In addition, the width 140W of each of the third drain lines 140b may be the same as the width 130W of each of the second drain lines 130b, and the length 140L of each of the third drain lines 140b may be the same as the length 130L of each of the second drain lines 130b. For example, when viewed in plan, each of the third drain lines 140b may have substantially the same size and shape (e.g., the same size and shape within manufacturing tolerances and/or material tolerances) as those of each of the second drain lines 130b.

In some example embodiments, the widths 120W, 130W, and 140W of the first, second, and third source lines 120a, 130a, and 140a may be the same, and the lengths 120L, 130L, and 140L of the first, second, and third source lines 120a, 130a, and 140a may be the same. When viewed in plan, the first, second, and third source lines 120a, 130a, and 140a may overlap each other and have the same size and shape. In addition, the widths 120W, 130W, and 140W of the first, second, and third drain lines 120b, 130b, and 140b may be the same, and the lengths 120L, 130L, and 140L of the first, second, and third drain lines 120b, 130b, and 140b may be the same. When viewed in plan, the first, second, and third drain lines 120b, 130b, and 140b may overlap each other and have the same size and shape.

Referring back to FIGS. 2 and 3A to 3C, the third conductive lines 140 may include one or more of metal and conductive metal nitride. The third conductive lines 140 may include, for example, copper. The second via contacts V2 may include the same material as that of the third conductive lines 140 such that the second via contacts V2 and the third conductive lines 140 include (e.g., at least partially comprise) a common material. Each of the second via contacts V2 and its corresponding one of the third conductive lines 140 may be coupled to constitute a single body. For example, each of the second via contacts V2 and the corresponding third conductive line 140 may be in contact with each other without boundary therebetween. In some example embodiments, the third conductive lines 140 and the second via contacts V2 may include the same material as that of the second conductive lines 130 and the first via contacts V1. In some example embodiments, the first, second, and third conductive lines 120, 130, and 140 may include the same material as that of the first and second via contacts V1 and V2, such that the first via contacts V1, the second via contacts V2, the first conductive lines 120, the second conductive lines 130, and the third conductive lines 140 include a common material.

Fourth conductive lines 150 may be provided on the third conductive lines 140. The fourth conductive lines 150 may be positioned at a height from the substrate 100 greater than that of the third conductive lines 140. Third via contacts V3 may be provided between the third conductive lines 140 and the fourth conductive lines 150. The third via contacts V3 may be positioned at a height from the substrate 100 between that of the third conductive lines 140 and that of the fourth conductive lines 150. Each of the fourth conductive lines 150 may be connected to a corresponding one of the third conductive lines 140 through a corresponding one of the third via contacts V3. For example, the fourth conductive lines 150 may be connected to the third drain lines 140b of the third conductive lines 140. Although not shown, an additional line and/or an additional contact may be connected to the third source line 140a of the third conductive lines 140.

The first interlayer dielectric layer 112 may be provided thereon with a second interlayer dielectric layer 160 that covers the first, second, third, and fourth conductive lines 120, 130, 140, and 150 and also covers the first, second, and third via contacts V1, V2, and V3. The fourth conductive lines 150 may have top surfaces coplanar with that of the second interlayer dielectric layer 160. The top surfaces of the fourth conductive lines 150 may be located at substantially the same height (e.g., the same height within manufacturing tolerances and/or material tolerances) from the substrate 100 as that of the top surface of the second interlayer dielectric layer 160. The second interlayer dielectric layer 160 may be provided thereon with a third interlayer dielectric layer 170 covering the top surfaces of the fourth conductive lines 150. The second and third interlayer dielectric layers 160 and 170 may include, for example, one or more of silicon oxide and silicon oxynitride.

Bottom contact plugs BEC may be provided in the third interlayer dielectric layer 170. Each of the bottom contact plugs BEC may penetrate the third interlayer dielectric layer 170 and may be connected to a corresponding one of the fourth conductive lines 150. Each of the bottom contact plugs BEC may directly contact a top surface of a corresponding one of the fourth conductive lines 150. The bottom contact plugs BEC may include one or more of doped semiconductor (e.g., doped silicon), metal (e.g., tungsten, titanium, and/or tantalum), conductive metal nitride (e.g., titanium nitride, tantalum nitride, and/or tungsten nitride), and metal-semiconductor compound (e.g., metal silicide). In some example embodiments, the bottom contact plugs BEC may have top surfaces substantially coplanar (e.g., coplanar within manufacturing tolerances and/or material tolerances) with that of the third interlayer dielectric layer 170.

Data storage structures DS may be provided on the third interlayer dielectric layer 170. When viewed in plan, the data storage structures DS may be two-dimensionally arranged along the first direction D1 and the second direction D2. The data storage structures DS may be correspondingly connected to the bottom contact plugs BEC.

Each of the data storage structures DS may be connected to one terminal of a transistor TR provided on each of the active regions ACT. The transistor TR may include one of the gate structures GS, the source region S, and the drain region D, which source and drain regions S and D are provided on opposite sides of the one of the gate structures GS. Each of the data storage structures DS may be connected to the drain region D of the transistor TR through its corresponding bottom contact plug BEC, fourth conductive line 150, third via contact V3, third drain line 140b, second via contact V2, second drain line 130b, first via contact V1, first drain line 120b, and drain contact 110b. Accordingly, and as shown with regard to at least FIGS. 5A-5B, each of the elements of a data structure DS, including a magnetic tunnel junction MTJ of the data structure DS, may be connected to at least the drain contact 110b. The first, second, and third source lines 120a, 130a, and 140a may be connected through the source contact 110a to the source region S of the transistor TR. Each of the data storage structures DS and its connected transistor TR may constitute the unit memory cell MC discussed with reference to FIG. 1.

When a single source line is connected to the source region S of the transistor TR, an electric resistance of the single source line may directly influence the electrical resistance of the unit memory cell MC. For example, when the single source line has a relatively large resistance, the unit memory cell MC may increase in resistance.

According to some example embodiments, the first, second, and third source lines 120a, 130a, and 140a may be connected in parallel to each other through the pair of first via contacts V1 and the pair of second via contacts V2, and as a result, the first, second, and third source lines 120a, 130a, and 140a may decrease in total resistance. Since the first, second, and third source lines 120a, 130a, and 140a are connected to the source region S of the transistor TR, the unit memory cell MC may decrease in resistance.

When viewed in plan, the first, second, and third source lines 120a, 130a, and 140a may overlap each other and have the same size and shape. When viewed in plan, the first, second, and third drain lines 120b, 130b, and 140b may also overlap each other and also have the same size and shape. In this case, a fabrication process may be easily performed to form the first, second, and third conductive lines 120, 130, and 140.

Each of the first via contacts V1 may align in the third direction D3 either with the source contact 110a or with the drain contact 110b, and the second via contacts V2 may align in the third direction D3 with corresponding first via contacts V1. When viewed in plan, the first and second via contacts V1 and V2 may overlap each other and have the same size and shape. In this case, a fabrication process may be easily performed to form the first and second via contacts V1 and V2.

Referring to FIGS. 5A and 5B, each of the data storage structures DS may include a bottom electrode BE, a magnetic tunnel junction MTJ, and a top electrode TE. The bottom electrode BE may be interposed between the magnetic tunnel junction MTJ and each of the bottom contact plugs BEC, and the top electrode TE may be spaced apart from the bottom electrode BE across the magnetic tunnel junction MTJ. The magnetic tunnel junction MTJ may be interposed between the bottom electrode BE and the top electrode TE. The bottom electrode BE and the top electrode TE may include, for example, metal or conductive metal nitride (e.g., titanium nitride or tantalum nitride).

The magnetic tunnel junction MTJ may include a reference layer ML1, a free layer ML2, and a tunnel barrier TBL between the reference and free layers ML1 and ML2. The reference layer ML1 may have a magnetization direction MD1 fixed in one direction, and the free layer ML2 may have a magnetization direction MD2 that can be changed parallel or anti-parallel to the magnetization direction MD1 of the reference layer ML1. Each of FIGS. 5A and 5B shows an example in which the free layer ML2 is interposed between the tunnel barrier TBL and the top electrode TE, but inventive concepts are not limited thereto. Unlike those shown in FIGS. 5A and 5B, the free layer ML2 may be interposed between the tunnel barrier TBL and the bottom electrode BE. Referring to FIG. 5A, the magnetization directions MD1 and MD2 of the reference and free layers ML1 and ML2 may be parallel to an interface between the tunnel barrier TBL and the free layer ML2. In this case, each of the reference and free layers ML1 and ML2 may include a ferromagnetic material. The reference layer ML1 may further include an anti-ferromagnetic material that fixes a magnetization direction of the ferromagnetic material. Referring to FIG. 5B, the magnetization directions MD1 and MD2 of the reference and free layers ML1 and ML2 may be perpendicular to the interface between the tunnel barrier TBL and the free layer ML2. In this case, each of the reference and free layers ML1 and ML2 may include one or more of a perpendicular magnetic material (e.g., CoFeTb, CoFeGd, or CoFeDy), a perpendicular magnetic material having an $L_{10}$ structure, CoPt of a hexagonal close packed (HCP) lattice structure, and a perpendicular magnetization structure. The perpendicular magnetic material having the $L_{10}$ structure may include one or more of FePt of the $L_{10}$ structure, FePd of the $L_{10}$ structure, CoPd of the $L_{10}$ structure, and CoPt of the $L_{10}$ structure. The perpendicular magnetization structure may include magnetic layers and non-magnetic layers that are alternately and repeatedly stacked. For example, the perpendicular magnetization structure may include one or more of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where, n is the stack number).

Referring back to FIGS. 2 and 3A to 3C, the third interlayer dielectric layer 170 may be provided thereon with a fourth interlayer dielectric layer 180 covering the data storage structures DS. The fourth interlayer dielectric layer 180 may include, for example, one or more of silicon oxide and silicon oxynitride. Bit lines BL may be provided on the fourth interlayer dielectric layer 180. The bit lines BL may extend in the first direction D1 and may be spaced apart from each other in the second direction D2. Each of the data storage structures DS may be connected to a corresponding one of the bit lines BL. Each of the bit lines BL may be connected to the data storage structures DS arranged in the first direction D1. The bit lines BL may include metal (e.g., tungsten).

FIGS. 6A, 7A, 8A, and 9A illustrate cross-sectional views taken along line I-I' of FIG. 2, showing a method of fabricating a semiconductor device according to some example embodiments of inventive concepts. FIGS. 6B, 7B, 8B, and 9B illustrate cross-sectional views taken along line II-II' of FIG. 2, showing a method of fabricating a semiconductor device according to some example embodiments of inventive concepts. FIGS. 6C, 7C, 8C, and 9C illustrate cross-sectional views taken along line III-III' of FIG. 2, showing a method of fabricating a semiconductor device according to some example embodiments of inventive concepts. Repetitive explanations to those of the semiconductor device discussed with reference to FIGS. 2, 3A to 3C, 4, 5A, and 5B will be omitted for brevity of description.

Referring to FIGS. 2 and 6A to 6C, a trench T may be formed in a substrate 100 and may define a plurality of active regions ACT. For example, the formation of the trench T may include forming on the substrate 100 a mask pattern defining an area where the plurality of active regions ACT are formed, and using the mask pattern as an etching mask to etch the substrate 100. A device isolation layer ST may be formed in the trench T. For example, the formation of the device isolation layer ST may include forming on the substrate 100 an insulation layer filling the trench T, and performing a planarization process on the insulation layer until the substrate 100 is exposed. The planarization process may form the device isolation layer ST locally in the trench T.

A plurality of gate structures GS may be formed on the substrate 100. The plurality of gate structures GS may be formed to run across the active regions ACT. The gate structures GS may be spaced apart from each other in a first direction D1 and may extend in a second direction D2. Each of the gate structures GS may include a gate dielectric pattern GI, a gate electrode GE, and a gate capping pattern CAP that are sequentially stacked on the substrate 100. Each of the gate structures GS may further include gate spacers GSP on lateral surfaces of the gate electrode GE. The formation of the gate structures GS may include sequentially forming a gate dielectric layer and a gate electrode layer on the substrate 100, forming the gate capping pattern CAP on the gate electrode layer, and using the gate capping pattern CAP as an etching mask to sequentially etch the gate electrode layer and the gate dielectric layer. The gate electrode layer and the gate dielectric layer may be etched to respectively form the gate electrode GE and the gate dielectric pattern GI. The formation of the gate structures GS may further include forming on the substrate 100 a spacer layer conformally covering the gate dielectric pattern GI, the gate electrode GE, and the gate capping pattern CAP, and anisotropically etching the spacer layer to form the gate spacers GSP.

A source region S and a drain region D may be formed in each of the active regions ACT. The source region S and the drain region D may be formed on opposite sides of each of the gate structures GS. The source region S and the drain region D may be formed by, for example, implanting impurities into the active region ACT on opposite sides of each of the gate structures GS. A first interlayer dielectric layer 112 may be formed on the substrate 100, and thus the gate structures GS, the source region S, and the drain region D may be covered with the first interlayer dielectric layer 112. A source contact 110a and a drain contact 110b may be formed in the first interlayer dielectric layer 112, and thus the source region S and the drain region D may be respectively connected to the source contact 110a and the drain contact 110b. The formation of the source contact 110a and the drain contact 110b may include forming in the first interlayer dielectric layer 112 contact holes exposing the source region S and the drain region D, forming on the first interlayer dielectric layer 112 a conductive layer filling the contact holes, and performing a planarization process on the conductive layer until a top surface of the first interlayer dielectric layer 112 is exposed. The planarization process may form the source contact 110a and the drain contact 110b locally in the contact holes.

Referring back to FIGS. 2 and 7A to 7C, first conductive lines 120 may be formed on the first interlayer dielectric layer 112. The formation of the first conductive lines 120 may include, for example, depositing and patterning a metal layer on the first interlayer dielectric layer 112, but inventive concepts are not limited thereto. The first conductive lines 120 may be formed at the same height from the substrate 100. The first conductive lines 120 may include a first source line 120a connected to the source contact 110a and a first drain line 120b connected to the drain contact 110b.

A lower insulation layer 162 may be formed on the first interlayer dielectric layer 112, covering the first conductive lines 120. First line trenches 130T and first via holes VH1 may be formed in the lower insulation layer 162. The first line trenches 130T may be formed at the same height from the substrate 100 and at a height greater than that of the first conductive lines 120. Each of the first line trenches 130T may be formed on and extending along a corresponding one of the first conductive lines 120. The first via holes VH1 may be formed at the same height from the substrate 100 and at a height between that of the first conductive lines 120 and that of the first line trenches 130T. Each of the first via holes VH1 may extend toward the substrate 100 from a bottom surface of a corresponding one of the first line trenches 130T. Each of the first via holes VH1 may be spatially connected to the corresponding first line trench 130T. Each of the first via holes VH1 may expose a top surface of a corresponding one of the first conductive lines 120.

Referring to FIGS. 2 and 8A to 8C, second conductive lines 130 and first via contacts V1 may be formed respectively in the first line trenches 130T and the first via holes VH1. For example, the formation of the second conductive lines 130 and the first via contacts V1 may include forming on the lower insulation layer 162 a metal layer filling the first line trenches 130T and the first via holes VH1, and performing a planarization process on the metal layer until a top surface of the lower insulation layer 162 is exposed. The planarization process may form the second conductive lines 130 and the first via contacts V1 locally in the first line trenches 130T and the first via holes VH1, respectively. The second conductive lines 130 may have top surfaces substantially coplanar (e.g., coplanar within manufacturing tolerances and/or material tolerances) with that of the lower insulation layer 162. The second conductive lines 130 and the first via contacts V1 may be formed at the same time and of the same material.

The second conductive lines 130 may include a second source line 130a connected to the first source line 120a of the first conductive lines 120, and also include a second drain line 130b connected to the first drain line 120b of the first conductive lines 120. The second source line 130a may be connected to the first source line 120a through corresponding first via contacts V1, and the second drain line 130b may be connected to the first drain line 120b through a corresponding first via contact V1. The second source line 130a may be connected to the first source line 120a through a pair of first via contacts V1. When viewed in plan, each of the pair of first via contacts V1 may be provided to overlap the source contact 110a on a corresponding active region ACT. For example, each of the pair of first via contacts V1 may align in a third direction D3 with the source contact 110a on the corresponding active region ACT. The first via contact V1 connected to the second drain line 130b may be provided to overlap the drain contact 110b when viewed in plan. For example, the first via contact V1 connected to the second drain line 130b may align in the third direction D3 with the drain contact 110b.

An intermediate insulation layer 164 may be formed on the lower insulation layer 162 and may cover the top surfaces of the second conductive lines 130. Second line trenches 140T and second via holes VH2 may be formed in the intermediate insulation layer 164. The second line trenches 140T may be formed at the same height from the substrate 100 and at a height greater than that of the second conductive lines 130. Each of the second line trenches 140T may be formed on and extending along a corresponding one of the second conductive line 130. The second via holes VH2 may be formed at the same height from the substrate 100 and at a height between that of the second conductive lines 130 and that of the second line trenches 140T. Each of the second via holes VH2 may extend toward the substrate 100 from a bottom surface of a corresponding one of the second line trenches 140T. Each of the second via holes VH2 may be spatially connected to the corresponding second line trench 140T. Each of the second via holes VH2 may expose a top surface of a corresponding one of the second conductive lines 130.

Referring to FIGS. 2 and 9A to 9C, third conductive lines 140 and second via contacts V2 may be formed respectively in the second line trenches 140T and the second via holes VH2. For example, the formation of the third conductive lines 140 and the second via contacts V2 may include forming on the intermediate insulation layer 164 a metal layer filling the second line trenches 140T and the second via holes VH2, and performing a planarization process on the metal layer until a top surface of the intermediate insulation layer 164 is exposed. The planarization process may form the third conductive lines 140 and the second via contacts V2 locally in the second line trenches 140T and the second via holes VH2, respectively. The third conductive lines 140 may have top surfaces substantially coplanar (e.g., coplanar within manufacturing tolerances and/or material tolerances) with that of the intermediate insulation layer 164. The third conductive lines 140 and the second via contacts V2 may be formed at the same time and of the same material.

The third conductive lines 140 may include a third source line 140a connected to the second source line 130a of the second conductive lines 130, and also include a third drain line 140b connected to the second drain line 130b of the second conductive lines 130. The third source line 140a may be connected to the second source line 130a through corresponding second via contacts V2, and the third drain line 140b may be connected to the second drain line 130b through a corresponding second via contact V2. The third source line 140a may be connected to the second source line 130a through a pair of second via contacts V2. When viewed in plan, each of the pair of second via contacts V2 may be formed to overlap the source contact 110a on a corresponding active region ACT. For example, each of the pair of second via contacts V2 may align in the third direction D3 with the source contact 110a on the corresponding active region ACT. The second via contact V2 connected to the third drain line 140b may be formed to overlap the drain contact 110b when viewed in plan. For example, the second via contact V2 connected to the third drain line 140b may align in the third direction D3 with the drain contact 110b.

When viewed in plan, the second via contacts V2 may be formed to overlap corresponding first via contacts V1. For example, each of the second via contacts V2 may be formed to align in the third direction D3 with a corresponding one of the first via contacts V1. When viewed in plan, the first and second via contacts V1 and V2 may have the same size and shape. In this case, one photomask may be used to form the first and second via contacts V1 and V2. For example, a photolithography process for forming the first via contacts V1 may use the same photomask as that used in a photolithography process for forming the second via contacts V2. As a result, the photolithography processes may be easily performed to form the first and second via contacts V1 and V2.

In some example embodiments, when viewed in plan, the second conductive lines 130 may be formed to overlap corresponding first conductive lines 120 and to have the same size and shape as those of the first conductive lines 120. When viewed in plan, the third conductive lines 140 may be formed to overlap corresponding second conductive lines 130 and to have the same size and shape as those of the second conductive lines 130. In this case, one photomask may be used to form the first, second, and third conductive lines 120, 130, and 140. For example, a photolithography process for forming the first conductive lines 120 may be performed to use the same photomask as that used in a photolithography process for forming the second conductive lines 130 and that used in a photolithography process for forming the third conductive lines 140. As a result, the photolithography processes may be easily performed to form the first, second, and third conductive lines 120, 130, and 140.

The intermediate insulation layer 164 may be provided thereon with an upper insulation layer 166 covering the top surfaces of the third conductive lines 140. Fourth conductive lines 150 and third via contacts V3 may be formed in the upper insulation layer 166. The fourth conductive lines 150 may be formed at a height from the substrate 100 greater than that of the third conductive lines 140. The third via contacts V3 may be formed at a height from the substrate 100 between that of the third conductive lines 140 and that of the fourth conductive lines 150. Each of the fourth conductive lines 150 may be connected to a corresponding one of the third conductive lines 140 through a corresponding one of the third via contacts V3. For example, the fourth conductive lines 150 may be connected to the third drain lines 140b of the third conductive lines 140. Although not shown, an additional line and/or an additional contact may be formed in the upper insulation layer 166 and connected to the third source line 140a of the third conductive lines 140. The fourth conductive lines 150 and the third via contacts V3 may be formed by substantially the same fabrication method (e.g., the same fabrication method within manufacturing tolerances and/or material tolerances) as that used for forming, for example, the second conductive lines 130 and the first via contacts V1 (or the third conductive lines 140 and the second via contacts V2).

The lower, intermediate, and upper insulation layers 162, 164, and 166 may include the same material. For example, the lower, intermediate, and upper insulation layers 162, 164, and 166 may include one or more of silicon oxide and silicon oxynitride. The lower, intermediate, and upper insulation layers 162, 164, and 166 may constitute a second interlayer dielectric layer 160.

Referring back to FIGS. 2 and 3A to 3C, the second interlayer dielectric layer 160 may be provided thereon with a third interlayer dielectric layer 170 covering the fourth conductive lines 150. Bottom contact plugs BEC may be formed in the third interlayer dielectric layer 170. The formation of the bottom contact plugs BEC may include, for example, forming bottom contact holes to penetrate the third interlayer dielectric layer 170, and forming the bottom contact plugs BEC in corresponding bottom contact holes. Each of the bottom contact holes may expose a top surface of a corresponding one of the fourth conductive lines 150. The bottom contact plugs BEC may have top surfaces substantially coplanar (e.g., coplanar within manufacturing tolerances and/or material tolerances) with that of the third interlayer dielectric layer 170.

Data storage structures DS may be formed on the third interlayer dielectric layer 170. The data storage structures DS may be correspondingly connected to the bottom contact plugs BEC. As discussed with reference to FIGS. 5A and 5B, each of the data storage structures DS may include a bottom electrode BE, a magnetic tunnel junction MTJ, and a top electrode TE that are sequentially stacked on the bottom contact plug BEC. In this case, the formation of the data storage structures DS may include sequentially forming a bottom electrode layer and a magnetic tunnel junction layer on the third interlayer dielectric layer 170, forming a conductive mask pattern on the magnetic tunnel junction layer, and using the conductive mask pattern as an etching mask to sequentially etch the magnetic tunnel junction layer and the bottom electrode layer. The magnetic tunnel junction layer and the bottom electrode layer may be etched to respectively form the magnetic tunnel junction MTJ and the bottom electrode BE. The conductive mask pattern may remain on the magnetic tunnel junction MTJ after the etching process, and the remainder of the conductive mask pattern may be defined as the top electrode TE.

A fourth interlayer dielectric layer 180 covering the data storage structures DS may be formed on the third interlayer dielectric layer 170, and bit lines BL may be formed on the fourth interlayer dielectric layer 180. Each of the data storage structures DS may be connected to a corresponding one of the bit lines BL.

According to some example embodiments, since the first, second, and third source lines 120a, 130a, and 140a are connected in parallel to the source region S of the transistor TR, the unit memory cell MC may decrease in resistance. When viewed in plan, the first, second, and third source lines 120a, 130a, and 140a may overlap each other and have the same size and shape. When viewed in plan, the first, second, and third drain lines 120b, 130b, and 140b may also overlap each other and also have the same size and shape. In this case, a fabrication process may be easily performed to form the first, second, and third conductive lines 120, 130, and 140. When viewed in plan, the first and second via contacts V1 and V2 may overlap each other and have the same size and shape. In this case, a fabrication process may be easily performed to form the first and second via contacts V1 and V2.

As a result, a semiconductor device may be easily fabricated to have improved electrical characteristics.

According to some example embodiments, a plurality of conductive lines may be connected in parallel to a source region of a transistor, and thus it may be possible to reduce a resistance of a unit memory cell including the transistor and a data storage structure connected to the transistor. When viewed in plan, the plurality of conductive lines may overlap each other and have the same size and shape. Thus, a fabrication process may be easily performed to form the plurality of conductive lines.

When the plurality of conductive lines include a first conductive line, a second conductive line, and a third conductive line at different heights from a substrate, the second conductive line may be connected to the first conductive line through first via contacts, and the third conductive line may be electrically connected to the second conductive line through second via contacts. When viewed in plan, the first and second via contacts may overlap each other and have the same size and shape. Thus, a fabrication process may be easily performed to form the first and second via contacts.

It therefore may be possible to fabricate easily a semiconductor device with improved electrical characteristics.

The aforementioned description provides example embodiments for explaining inventive concepts. Therefore, inventive concepts are not limited to the embodiments described above, and it will be understood by one of ordinary skill in the art that variations in form and detail may be made therein without departing from the spirit and essential features of inventive concepts.

The invention claimed is:

1. A semiconductor device, comprising:
a first gate structure and a second gate structure on a substrate, the second gate structure being spaced apart from the first gate structure in a first direction, the first and second gate structures extending in a second direction intersecting the first direction, and the first direction and the second direction being parallel to a top surface of the substrate;
a source contact and a drain contact on opposite sides of the first gate structure, respectively, the source contact and the drain contact each connected to the substrate;
a magnetic tunnel junction connected to the drain contact;
a first conductive line connected to the source contact; and
a second conductive line connected to the first conductive line through a first via contact,
wherein the second conductive line is distal from the substrate in relation to the first conductive line,
wherein the first conductive line and the second conductive line extend in parallel to each other along the first direction and each of the first conductive line and the second conductive line extends over at least some of the first and second gate structures, wherein each of the first conductive line and the second conductive line has a width in the second direction, the width of the first conductive line and the width of the second conductive line being a same width, and wherein the first via contact is aligned with the source contact along a third direction perpendicular to the top surface of the substrate.

2. The semiconductor device of claim 1, wherein the first via contact and the second conductive line include a same material.

3. The semiconductor device of claim 1, wherein
each of the first conductive line and the second conductive line has a length in the first direction, and
the length of the first conductive line and the length of the second conductive line is a same length.

4. The semiconductor device of claim 1, further comprising:
a third conductive line connected to the second conductive line through a second via contact,
wherein the third conductive line is distal from the substrate in relation to the second conductive line,
wherein the first conductive line, the second conductive line, and the third conductive line extend in parallel to each other along the first direction, and
wherein the second via contact is aligned with the source contact along the third direction.

5. The semiconductor device of claim 4, wherein, when viewed in plan, the second via contact and the first via contact have a same size and shape.

6. The semiconductor device of claim 4, wherein
the first via contact has a first width in the first direction and a second width in the second direction, and
the second via contact has a third width in the first direction and a fourth width in the second direction,
wherein the first width is substantially the same as the third width, and
wherein the second width is substantially the same as the fourth width.

7. The semiconductor device of claim 4, wherein
the third conductive line has a width in the second direction, and
the width of the third conductive line is the same as the width of the first conductive line in the second direction and the width of the second conductive line in the second direction.

8. The semiconductor device of claim 7, wherein
each of the first conductive line, the second conductive line, and the third conductive line has a length in the first direction, and
the length of the first conductive line in the first direction is the same as both the length of the second conductive line in the first direction and the length of the third conductive line in the first direction.

9. The semiconductor device of claim 4, wherein the second via contact and the third conductive line include a same material.

10. The semiconductor device of claim 4, wherein the first via contact, the second via contact, the first conductive line, the second conductive line, and the third conductive line include a same material.

11. A semiconductor device, comprising:
a substrate including a first active region and a second active region;
a pair of first gate structures extending over the first active region;
a pair of second gate structures extending over the second active region;
a first source contact between the pair of first gate structures, the first source contact connected to the first active region;
a second source contact between the pair of second gate structures, the second source contact connected to the second active region;
a first conductive line extending over the pair of first gate structures and the pair of second gate structures, the first conductive line connected to the first source contact and the second source contact; and
a second conductive line connected to the first conductive line through a plurality of first via contacts,
wherein the second conductive line is distal from the substrate in relation to the first conductive line,
wherein the first conductive line and the second conductive line extend in parallel to each other along a first direction,
wherein one via contact of the plurality of first via contacts is aligned with the first source contact along a direction perpendicular to a top surface of the substrate, and
wherein another via contact of the plurality of first via contacts is aligned with the second source contact along the direction perpendicular to the top surface of the substrate.

12. The semiconductor device of claim 11, wherein the pair of first gate structures and the pair of second gate structures are isolated from direct contact with each other in the first direction and extend in a second direction intersecting the first direction.

13. The semiconductor device of claim 11, wherein the plurality of first via contacts are between the first conductive line and the second conductive line.

14. The semiconductor device of claim 11, wherein the plurality of first via contacts and the second conductive line include a same material.

15. The semiconductor device of claim 11, further comprising:
a third conductive line connected to the second conductive line through a plurality of second via contacts,
wherein the third conductive line is distal from the substrate in relation to the second conductive line,
wherein the first conductive line, the second conductive line, and the third conductive line extend in parallel to each other along the first direction, and
wherein the plurality of second via contacts are correspondingly aligned with the plurality of first via contacts along the direction perpendicular to the top surface of the substrate.

16. The semiconductor device of claim 15, wherein the plurality of second via contacts are between the second conductive line and the third conductive line.

17. The semiconductor device of claim 16, wherein, when viewed in plan, each via contact of the plurality of second via contacts and each via contact of the plurality of first via contacts have a same size and shape.

18. The semiconductor device of claim 16, wherein
each via contact of the plurality of first via contacts has a first width in the first direction and a second width in a second direction perpendicular to the first direction, the first and second directions being parallel to the top surface of the substrate, and each via contact of the plurality of second via contacts has a third width in the first direction and a fourth width in the second direction, wherein the first width is substantially the same as the third width, and the second width is substantially the same as the fourth width.

19. The semiconductor device of claim 15, wherein the plurality of second via contacts and the third conductive line include a same material.

20. The semiconductor device of claim 15, wherein one via contact of the plurality of second via contacts is aligned with the first source contact along the direction perpendicular to the top surface of the substrate, and another via contact of the plurality of second via contacts is aligned with the second source contact along the direction perpendicular to the top surface of the substrate.

* * * * *